United States Patent
Liu et al.

(10) Patent No.: US 10,615,273 B2
(45) Date of Patent: Apr. 7, 2020

(54) SEMICONDUCTOR DEVICES HAVING A PLURALITY OF UNIT CELL TRANSISTORS THAT HAVE SMOOTHED TURN-ON BEHAVIOR AND IMPROVED LINEARITY

(71) Applicant: Cree, Inc., Durham, NC (US)

(72) Inventors: Yueying Liu, Morrisville, NC (US);
Saptharishi Sriram, Cary, NC (US);
Scott Sheppard, Chapel Hill, NC (US)

(73) Assignee: Cree, Inc., Durham, NC (US)

( * ) Notice: Subject to any disclaimer, the term of this patent is extended or adjusted under 35 U.S.C. 154(b) by 0 days.

(21) Appl. No.: 15/628,932

(22) Filed: Jun. 21, 2017

(65) Prior Publication Data
US 2018/0374943 A1 Dec. 27, 2018

(51) Int. Cl.
*H01L 21/336* (2006.01)
*H01L 29/76* (2006.01)
(Continued)

(52) U.S. Cl.
CPC ........ *H01L 29/7787* (2013.01); *H01L 21/326* (2013.01); *H01L 21/8252* (2013.01);
(Continued)

(58) Field of Classification Search
CPC ............. H01L 21/8252; H01L 21/8258; H01L 27/0605; H01L 29/0696; H01L 29/0847; H01L 29/2003; H01L 29/41758; H01L 29/7831; H01L 27/20; H01L 29/7787; H01L 29/42368; H01L 29/205; H01L 29/66462; H01L 29/0673; H01L 29/1037; H01L 29/7786; H01L 2029/42388; H01L 29/201; H01L 29/1066; H01L 29/42364; H01L 21/8213; H03H 9/02574; H03H 9/02228; H03H 9/02976; H03H 9/0542; H03H 3/08
See application file for complete search history.

(56) References Cited

U.S. PATENT DOCUMENTS 3,586,930 A 6/1971 Das et al.
6,818,951 B2 * 11/2004 Moller ............ H01L 21/26586
257/341
(Continued)

FOREIGN PATENT DOCUMENTS

EP 2 040 299 A1 3/2009

OTHER PUBLICATIONS

Kazutaka Inoue et al., "Linearity Improvement of GaN HEMT for Wireless Communication Applications," SEI Technical Review, No. 78, Apr. 2014.
(Continued)

*Primary Examiner* — Mary A Wilczewski
*Assistant Examiner* — Tsz K Chiu
(74) *Attorney, Agent, or Firm* — Myers Bigel, P.A.

(57) ABSTRACT

A semiconductor device includes a plurality of unit cell transistors on a common semiconductor structure, the unit cell transistors electrically connected in parallel, and each unit cell transistor including a respective gate finger. Respective threshold voltages of first and second of the unit cell transistors differ by at least 0.1 volts and/or threshold voltages of first and second segments of a third of the unit cell transistors differ by at least 0.1 volts.

19 Claims, 15 Drawing Sheets

(51) Int. Cl.

| | | |
|---|---|---|
| *H01L 29/778* | (2006.01) | |
| *H01L 29/06* | (2006.01) | |
| *H01L 29/423* | (2006.01) | |
| *H01L 27/095* | (2006.01) | |
| *H01L 21/8252* | (2006.01) | |
| *H01L 29/66* | (2006.01) | |
| *H01L 21/326* | (2006.01) | |
| *H01L 29/205* | (2006.01) | |
| *H01L 23/482* | (2006.01) | |
| *H03F 1/32* | (2006.01) | |
| *H01L 29/47* | (2006.01) | |
| *H01L 29/10* | (2006.01) | |
| *H01L 29/201* | (2006.01) | |
| *H01L 29/20* | (2006.01) | |
| *H01L 29/417* | (2006.01) | |

(52) U.S. Cl.
CPC ........ *H01L 23/4824* (2013.01); *H01L 27/095* (2013.01); *H01L 29/0696* (2013.01); *H01L 29/1041* (2013.01); *H01L 29/201* (2013.01); *H01L 29/205* (2013.01); *H01L 29/42312* (2013.01); *H01L 29/42316* (2013.01); *H01L 29/475* (2013.01); *H01L 29/66462* (2013.01); *H01L 29/7786* (2013.01); *H03F 1/3205* (2013.01); *H01L 29/2003* (2013.01); *H01L 29/41758* (2013.01); *H03F 2200/366* (2013.01)

(56) References Cited

U.S. PATENT DOCUMENTS

| | | | | |
|---|---|---|---|---|
| 7,288,803 | B2* | 10/2007 | Beach | H01L 29/0692 |
| | | | | 257/192 |
| 9,048,838 | B2* | 6/2015 | Otremba | H03K 17/102 |
| 9,620,424 | B2* | 4/2017 | Blin | H01L 27/1203 |
| 10,038,064 | B2* | 7/2018 | Tanaka | H01L 29/7787 |
| 10,103,239 | B1* | 10/2018 | Chou | H01L 29/42316 |
| 10,268,789 | B1* | 4/2019 | Flowers | G06F 17/5036 |
| 2005/0127365 | A1 | 6/2005 | Koyama | |
| 2006/0081985 | A1* | 4/2006 | Beach | H01L 29/0692 |
| | | | | 257/745 |
| 2006/0231905 | A1 | 10/2006 | Roedle et al. | |
| 2007/0287404 | A1 | 12/2007 | Arnborg | |
| 2008/0157222 | A1 | 7/2008 | Wang | |
| 2012/0001230 | A1* | 1/2012 | Takatani | H01L 21/76895 |
| | | | | 257/194 |
| 2012/0228632 | A1* | 9/2012 | Takada | H01L 21/8213 |
| | | | | 257/77 |
| 2013/0062625 | A1* | 3/2013 | Takada | H01L 29/41758 |
| | | | | 257/77 |
| 2015/0129965 | A1 | 5/2015 | Roy et al. | |
| 2015/0171108 | A1* | 6/2015 | Blin | H01L 27/1203 |
| | | | | 257/347 |
| 2015/0255547 | A1* | 9/2015 | Yuan | H01L 29/7788 |
| | | | | 257/76 |
| 2016/0181364 | A1* | 6/2016 | Stewart | H01L 29/42316 |
| | | | | 257/192 |
| 2016/0373106 | A1* | 12/2016 | Shah | H01L 27/0207 |
| 2017/0018639 | A1* | 1/2017 | Teo | H01L 29/7788 |
| 2018/0033631 | A1* | 2/2018 | Bera | H01L 29/404 |
| 2018/0197999 | A1* | 7/2018 | Palacios | H01L 29/7786 |
| 2019/0341480 | A1 | 11/2019 | Boles et al. | |

OTHER PUBLICATIONS

Christian Fager, et al., Prediction of IMD in LDMOS Transistor Amplifiers Using a New Large-Signal Model, IEEE Transactions on Microwave Theory and Techniques, vol. 50, No. 12, Dec. 2002.

Notification of Transmittal of the International Search Report and the Written Opinion of the International Searching Authority, or the Declaration, for corresponding International Application No. PCT/US2018/037760, dated Oct. 8, 2018, 16 pages.

Notification Concerning Transmittal of International Preliminary Report on Patentability, for corresponding International Application No. PCT/US2018/037760, dated Jan. 2, 2020, 10 pgs.

Bonkee Kim et al., "A New Linearization Technique for MOSFET RF Amplifier Using Multiple Gated Transistors," IEEE Microwav and Guided Wave Letters, IEEE Inc., New York US, vol. 10, No. 9, Sep. 1, 2000.

Notification of Transmittal of the International Search Report and the Written Opinion of the International Searching Authority, or the Declaration, corresponding to International Application No. PCT/US2019/061371, dated Feb. 3, 2020.

* cited by examiner

SEMICONDUCTOR DEVICES HAVING A PLURALITY OF UNIT CELL TRANSISTORS THAT HAVE SMOOTHED TURN-ON BEHAVIOR AND IMPROVED LINEARITY

FIELD

The present invention described herein relates to microelectronic devices and more particularly to high power field effect transistors having unit cell-based structures.

BACKGROUND

Electrical circuits requiring high power handling capability while operating at high frequencies, such as radio frequencies (500 MHz), S-band (3 GHz) and X-band (10 GHz), have in recent years become more prevalent. Because of the increase in high power, high frequency circuits, there has been a corresponding increase in demand for semiconductor devices which are capable of reliably operating at radio and microwave frequencies while still being capable of handling high power loads.

To provide increased output power, semiconductor devices have been developed that include a plurality of "unit cell" transistors that are formed on a common semiconductor structure and that are electrically connected in parallel. Each unit cell transistor may include a gate finger that extends in parallel between elongated source and drain contacts, as is schematically illustrated in FIG. 1.

In particular, FIG. 1 illustrates a metal layout of a conventional semiconductor device 10 that includes a gate pad 12, a source pad 22 and a drain pad 32 on a semiconductor structure 20. FIG. 1 is a plan view of the semiconductor device (i.e., looking down at the device from above) that illustrates various metal contact structures of the semiconductor device 10 that are formed on the underlying semiconductor structure 20. As shown in FIG. 1, in the conventional semiconductor device 10, the gate pad 12 is connected by a gate bus 14 to a plurality of gate fingers 16 that extend in parallel in a first direction (e.g., the y-direction indicated in FIG. 1). The drain pad 32 is connected to a plurality of drain contacts 36 via a drain bus 34. The source pad 22 is connected to a plurality of parallel source contacts 26 via a source bus 24 that is disposed at a different metallization layer (here a higher metallization layer that runs above the gate fingers 16 and the drain contacts 36). Vertically-extending (i.e., extending in a z-direction that is perpendicular to the x-direction and the y-direction) source contact plugs 28 electrically connect each source contact 26 to the source bus 24.

Each gate finger 16 runs along the y-direction between a pair of adjacent source and drain contacts 26, 36. A unit cell transistor of semiconductor device 10 is illustrated at box 40, and includes a gate finger 16 that extends between adjacent source and drain contacts 26, 36. The "gate length" refers to the distance of the gate metallization in the x-direction, while the "gate width" is the distance by which the gate fingers 16 and the source and drain contacts 26, 36 overlap in the y-direction. That is, "width" of a gate finger 16 refers to the dimension of the gate finger 16 that extends in parallel to the adjacent source/drain contacts 26, 36 (the distance along the y-direction). The power handling capability of the semiconductor device 10 may be proportional to its "gate periphery." The gate periphery of semiconductor device 10 is the sum of the gate widths for each gate finger 16 of the semiconductor device 10.

Semiconductor devices formed of wide band-gap semiconductor materials such as silicon carbide and/or gallium nitride based semiconductor materials may operate at higher current densities and hence are widely used in high power applications. In particular, gallium nitride based transistors that include one or more epitaxial layers of gallium nitride based semiconductor materials such as GaN, AlGaN, InGaN, etc. are now commonly used in high power applications such as transistor amplifiers for wireless communications. These gallium nitride based epitaxial layers are typically grown on silicon carbide or sapphire substrates. There is a need, however, for high power semiconductor devices that exhibit improved performance.

SUMMARY

Pursuant to embodiments of the present invention, semiconductor devices are provided that include a plurality of unit cell transistors that are formed on a common semiconductor structure. The unit cell transistors are electrically connected in parallel, and each unit cell transistor includes a gate finger. In some embodiments, the respective threshold voltages of first and second of the unit cell transistors differ by at least 0.1 volts and/or threshold voltages of first and second portions of a third of the unit cell transistors differ by at least 0.1 volts.

In some embodiments, the gate fingers may extend in parallel to one another. The semiconductor structure includes a gallium nitride based channel layer.

In some embodiments, the threshold voltage of the first and second of the unit cell transistors may differ by at least 0.25 volts. In some embodiments, the threshold voltages of the first and second segments of the third of the unit cell transistors may differ by at least 0.25 volts or by at least 0.5 volts. In some embodiments, the threshold voltage of the first and second of the unit cell transistors may differ by between 0.1-1.25 volts. In some embodiments, the threshold voltages of the first and second portions of the third of the unit cell transistors may differ by between 0.1-1.25 volts.

In some embodiments, the unit cell transistors may be divided into a plurality of groups, each group including at least five unit cell transistors, where the threshold voltages of the unit cell transistors within each group are within 0.01 volts of each other. Each group may include approximately the same number of unit cell transistors. The number of groups may be two or three in example embodiments.

In some embodiments, each gate finger may include at least two segments having threshold voltages that differ by at least 0.1 volts. In other embodiments, each gate finger may include at least two segments having threshold voltages that differ by at least 0.25 volts or by at least 0.5 volts. In still other embodiments, each gate finger may include at least two segments having threshold voltages that differ by between 0.1-1.25 volts.

In some embodiments, the semiconductor structure may include a gallium nitride based layer that acts as a barrier layer for each of the unit cell transistors, and a thickness of the gallium nitride based layer may vary in different regions of the semiconductor device. For example, in some embodiments, the gallium nitride based layer may have a first thickness underneath the first segment of the third of the unit cell transistors and may have a second, different thickness underneath the second segment of the third of the unit cell transistors. In other embodiments, the gallium nitride based layer may have a first thickness underneath the first of the unit cell transistors and may have a second thickness underneath the second of the unit cell transistors.

In some embodiments, a doping concentration of the portion of the channel layer that is underneath a gate finger of the third of the unit cell transistors may vary along the width of the gate finger of the third of the unit cell transistors.

In some embodiments, a first doping concentration of a first portion of the channel layer that is underneath a gate finger of the first of the unit cell transistors fingers may be different than a second doping concentration of a second portion of the channel layer that is underneath a gate finger of the second of the unit cell transistors. For example, one may be doped and the other may be undoped.

In some embodiments, at least a portion of a gate finger of the first of the unit cell transistors may be a different material than at least a portion of a gate finger of a second of the unit cell transistors.

Pursuant to further embodiments of the present invention, semiconductor devices are provided that include a plurality of unit cell transistors that are formed on a semiconductor structure. The unit cell transistors are electrically connected in parallel, and each unit cell transistor including a gate finger. Threshold voltages of at least a first subset of the unit cell transistors vary along the width of the respective gate fingers of the unit cell transistors in the first subset of the unit cell transistors.

In some embodiments, the threshold voltages of the unit cell transistors in the first subset of the unit cell transistors may vary by at least 0.1 volts along the width of their respective gate fingers. In other embodiments, the threshold voltages of the unit cell transistors in the first subset of the unit cell transistors may vary by at least 0.25 volts (or by at least 0.5 volts) along the width of their respective gate fingers. In still other embodiments, the threshold voltages of the unit cell transistors in the first subset of the unit cell transistors may vary by between 0.1-1.25 volts along the width of their respective gate fingers.

In some embodiments, the gate fingers of the unit cell transistors may extend in parallel to one another.

In some embodiments, the semiconductor structure may include a gallium nitride based channel layer.

In some embodiments, each gate finger may include at least three segments that have different threshold voltages.

In some embodiments, the semiconductor device may include a gallium nitride based layer that acts as a barrier layer for each of the unit cell transistors. The gallium nitride based layer may have at least two different thicknesses underneath at least half of the gate fingers.

In some embodiments, the semiconductor device may include a channel layer, and respective portions of the channel layer that are underneath the gate fingers may have different doping concentrations underneath at least two different portions of each of the respective gate fingers.

In some embodiments, each gate finger of the first subset of the unit cell transistors may have between two and five segments. A value of the threshold voltage of each unit cell transistor in the first subset of the unit cell transistors may be substantially constant along each segment, while different segments may have threshold voltages that vary by at least 0.1 volts from at least one other segment.

Pursuant to still further embodiments of the present invention, semiconductor devices are provided that include a plurality of unit cell transistors that are formed on a semiconductor structure. The unit cell transistors are electrically connected in parallel, and each unit cell transistor including a gate finger. Each unit cell transistor in a first subset of the unit cell transistors may have a first threshold voltage and each unit cell transistor in a second subset of the unit cell transistors may have a second threshold voltage that differs from the first threshold voltage.

In some embodiments, the first threshold voltage may differ from the second threshold voltage by at least 0.1 volts.

In some embodiments, the gate fingers may extend in parallel to one another.

In some embodiments, the semiconductor structure may include a gallium nitride based channel layer.

In some embodiments, the first threshold voltage may differ from the second threshold voltage by at least 0.25 volts or by at least 0.5 volts. In some embodiments, the first threshold voltage may differ from the second threshold voltage by between 0.1-1.25 volts.

In some embodiments, the first subset of the unit cell transistors and the second subset of the unit cell transistors may each include approximately the same number of unit cell transistors.

In some embodiments, each unit cell transistor in a third subset of the unit cell transistors may have a third threshold voltage that differs from both the first threshold voltage and the second threshold voltage.

In some embodiments, the semiconductor structure may include a gallium nitride based layer that acts as a barrier layer of each of the unit cell transistors. A thickness of the gallium nitride based layer under the gate fingers of each unit cell transistor in the first subset of the unit cell transistors may be different than a thickness of the barrier layer under the gate fingers in each unit cell transistor in the second subset of the unit cell transistors.

In some embodiments, the semiconductor device may include a channel layer, and a first doping concentration of a first portion of the channel layer that is underneath the gate fingers of the unit cell transistors in the first subset of the unit cell transistors may be different from a second doping concentration of a second portion of the channel layer that is underneath the gate fingers of the unit cell transistors in the second subset of the unit cell transistors.

Pursuant to still further embodiments of the present invention, a method of increasing the linearity of a semiconductor device is provided in which a semiconductor device is formed that includes a plurality of unit cell transistors on a common semiconductor structure, the unit cell transistors electrically connected in parallel, and each unit cell transistor including a gate finger. One or more voltage signals are applied to the gate fingers of the unit cell transistors in order to turn on different portions of the 2DEG channel of the semiconductor device at respective different levels of current flow.

In some embodiments, first and second segments of at least some of the gate fingers may have threshold voltages that differ by at least 0.1 volts. In other embodiments, these first and second segments may have threshold voltages that differ by at least 0.25 volts.

In some embodiments, different ones of the unit cell transistors may have threshold voltages that differ by at least 0.1 volts. In other embodiments, different ones of the unit cell transistors may have threshold voltages that differ by at least 0.25 volts or by at least 0.5 volts. In still other embodiments, different ones of the unit cell transistors may have threshold voltages that differ by between 0.1-1.25 volts.

In some embodiments, each unit cell transistor has substantially the same threshold voltage and the same structure. In these embodiments, a first of the voltage signals may be applied to a first subset of the gate fingers of the unit cell transistors and a second of the voltage signals that differs from the first voltage signal by at least 0.1 volts may be simultaneously applied to a second subset of the gate fingers of the unit cell transistors. In other embodiments, the first and second of the voltage signals may differ by at least 0.25 volts or be between 0.1-1.25 volts.

In some embodiments, the unit cell transistors may be divided into a plurality of groups, each group including at least five unit cell transistors. The threshold voltages of the unit cell transistors within each group may be within 0.01 volts of each other in some embodiments. Each group may include approximately the same number of unit cell transistors in some embodiments, and the number of groups may be two, three or more in various embodiments.

In some embodiments, the semiconductor structure may include a gallium nitride based channel layer and a gallium nitride based barrier layer on the gallium nitride based channel layer, and the gate fingers may extend in parallel to one another. In such embodiments, a thickness of the gallium nitride based barrier layer may vary in different regions of the semiconductor device. The gallium nitride based barrier layer may, for example, have a first thickness underneath a first segment of a first of the unit cell transistors and a second, different thickness underneath a second segment of the first of the unit cell transistors. Additionally or alternatively, the gallium nitride based layer may have a first thickness underneath a first subset of the unit cell transistors and a second thickness underneath a second subset of the unit cell transistors.

Pursuant to still further embodiments of the present invention, semiconductor devices are provided that include a plurality of unit cell transistors on a semiconductor structure. The unit cell transistors are electrically connected in parallel, and each unit cell transistor including a gate finger that extends above a gallium nitride based barrier layer of the semiconductor structure. A thickness of the gallium nitride based barrier layer is different in different locations within the semiconductor device.

In some embodiments, the gallium nitride based barrier layer may have a first thickness underneath respective first segments of the gate fingers of a first subset of the unit cell transistors and a second, different thickness underneath respective second segments of the gate fingers of the first subset of the unit cell transistors. The first and second thicknesses may differ, for example, by at least 1 nm.

In some embodiments, the gallium nitride based barrier layer may have a first thickness underneath a first subset of the unit cell transistors and a second thickness underneath a second subset of the unit cell transistors. The first and second thicknesses may differ, for example, by at least 1 nm.

In some embodiments, different subsets of the unit cell transistors may have threshold voltages that differ by at least 0.1 volts or by at least 0.25 volts or by at least 0.5 volts.

In some embodiments, different segments of at least one of the gate fingers may have threshold voltages that differ by at least 0.1 volts or by at least 0.25 volts or by at least 0.5 volts.

Pursuant to still further embodiments of the present invention, semiconductor devices are provided that include a plurality of unit cell transistors on a semiconductor structure that includes a gallium nitride based barrier layer. The unit cell transistors are electrically connected in parallel, and each unit cell transistor including a gate finger that extends above the gallium nitride based barrier layer. These devices further include a voltage divider that has a first output that is coupled to the gate fingers of a first subset of the unit cell transistors and a second output that is coupled to the gate fingers of a second subset of the unit cell transistors. The first and second outputs are configured to apply respective first and second voltages to the gate fingers of the respective first and second subsets of the unit cell transistors, where the first and second voltages differ by at least 0.1 volts.

In some embodiments, the unit cell transistors of the first and second subsets of unit cell transistors may have identical designs.

In some embodiments, the first and second voltages may differ by at least 0.25 volts.

In some embodiments, the voltage divider may include a third output that is coupled to the gate fingers of a third subset of the unit cell transistors, where the third output is configured to apply a third voltage to the gate fingers of the third subset of the unit cell transistors, the third voltage differing from both the first and second voltages by at least 0.1 volts (or by at least 0.25 volts or 0.5 volts in other embodiments).

DETAILED DESCRIPTION

Figure 1:
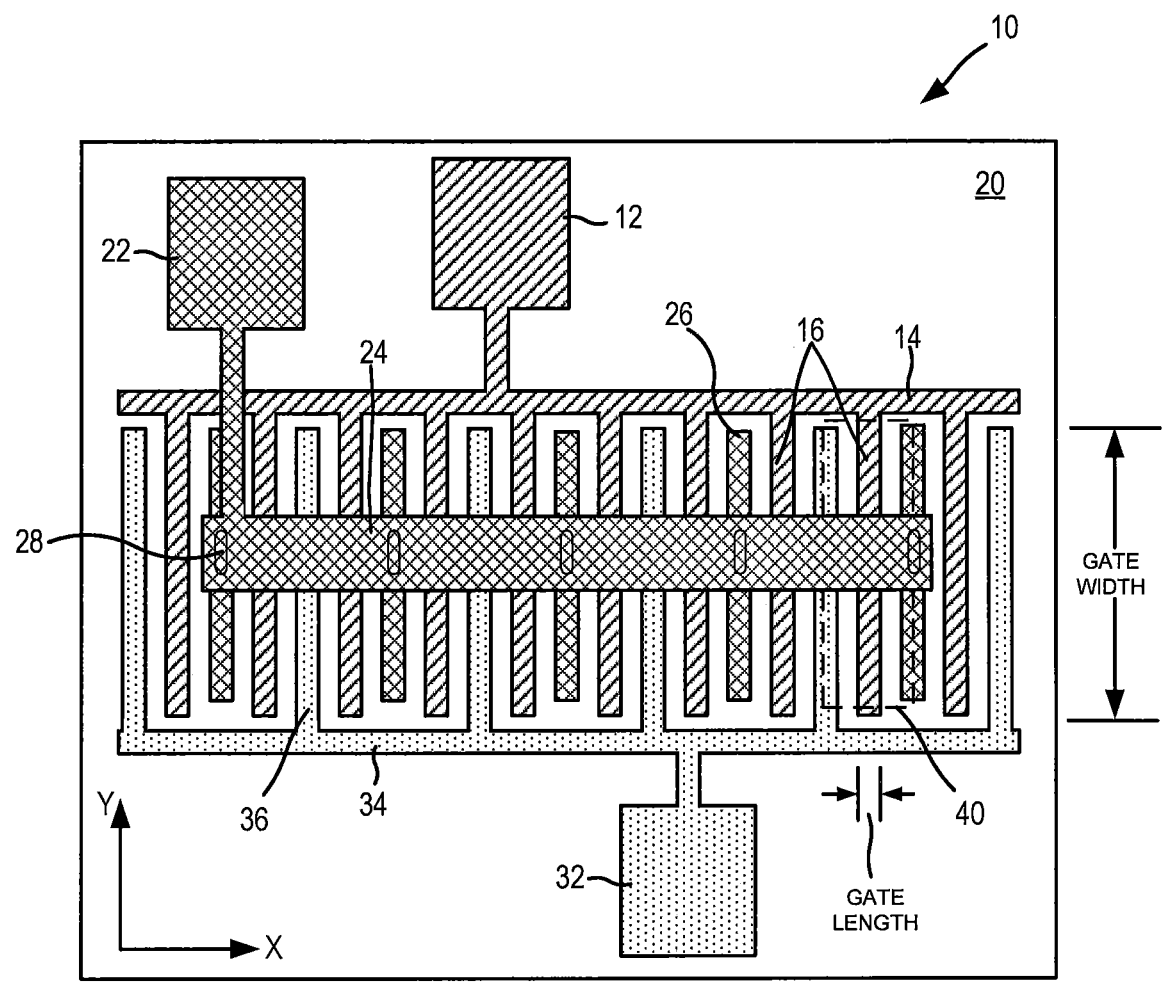
FIG. 1 is a plan view of a metal layout of a conventional multi-cell semiconductor device.

Embodiments of the present invention provide multi-cell semiconductor devices (i.e., a semiconductor device that includes a plurality of unit cell transistors) that may exhibit improved linearity. One common measure of the linearity of a multi-cell semiconductor device is the third order transconductance behavior of the device. Because multi-cell semiconductor devices formed in gallium nitride and various other wide bandgap semiconductor material systems may exhibit sharp turn-on behavior, multi-cell semiconductor devices formed in these material systems may exhibit significant variance in their third order transconductance response at device turn-on. Non-linearities in the third order transconductance may generate third order intermodulation products in the output signal of the transistor. If these third order intermodulation products fall within a channel of a communications system that includes the multi-cell semiconductor device, the third order intermodulation products may degrade the performance of the communications system. The third order transconductance at device turn-on is often the primary parameter contributing to third order intermodulation products in a multi-cell semiconductor device. The peak third order transconductance value increases proportionally with the size of the device. Thus, as applications require larger, higher power semiconductor devices, it may become increasingly difficult to provide a high degree of linearity.

Pursuant to embodiments of the present invention, multi-cell semiconductor devices are provided that may exhibit significantly improved linearity. This improved linearity may be achieved by engineering the threshold voltage of the device to provide the improved linearity, or by applying different gate voltages to different portions of the device. The semiconductor devices according to embodiments of the present invention may, in some embodiments, be high power devices that include a plurality of unit cells that are electrically connected in parallel. Each unit cell may include a gate finger, and the gate fingers may extend in parallel to each other.

The threshold voltage of a field effect transistor refers to the minimum gate-to-source voltage differential that is needed to allow current to pass between the source and drain terminals of the transistor. The multi-cell semiconductor devices according to embodiments of the present invention may have a variable threshold voltage that is different in different locations within the device. In some embodiments, distinct subsets of the gate fingers may have different threshold voltages. In other embodiments, the threshold voltage may vary along the widths of the respective gate fingers. In still other embodiments, the above two approaches can be combined. By designing the semiconductor devices to have different threshold voltages in different regions of the device, different portions of the 2DEG channel of the semiconductor device may turn on at different degrees in response to application of a gate voltage. In other words, different portions of the 2DEG channel of the semiconductor device may turn on at different levels of current flow. For example, in some embodiments, different portions of the 2DEG channel of the semiconductor device may have levels of current flow that differ by at least 5%. In other embodiments, different portions of the 2DEG channel of the semiconductor device may have levels of current flow that differ by at least 10%. In still other embodiments, different portions of the 2DEG channel of the semiconductor device may have levels of current flow that differ by between 10%-30%. As discussed above, semiconductor devices formed in wide band-gap semiconductor material systems such as, for example, gallium nitride based semiconductors, may exhibit fast turn-on behavior where all of the unit cells turn on essentially simultaneously. Since the third order transconductance tends to peak at turn-on, multi-cell semiconductor devices formed in such material systems may experience a large spike in the third order transconductance at device turn-on, since all of the unit cells turn on simultaneously. By varying the threshold voltage so that different portions of the device have different threshold voltages, the degree to which the channel is turned on at any given time will vary across the device, reducing the magnitude of the spike in the third order transconductance.

In some embodiments, the semiconductor devices may be high electron mobility transistors ("HEMT") that include a channel layer and a barrier layer. In such devices, the threshold voltage may be varied in different regions of the device by varying the thickness of the barrier layer. In other embodiments, the doping concentration of the barrier layer and/or the channel layer may be varied in different portions of the device to vary the threshold voltage. In still other embodiments, the composition of the gate fingers may be varied, either along the width of the gate finger and/or between different gate fingers. For example, different metals may be used and/or metal alloys having different compositions in order to vary the threshold voltage.

In still other embodiments, multi-cell semiconductor devices are provided that may include an associated voltage divider circuit that may be configured to provide different gate voltages to different unit cells of the device. These devices may have unit cells that have the same structure and configuration. However, by applying different gate voltages to different subsets of the gate fingers, different unit cell transistors can be configured to turn on at different degrees (i.e., at different levels of current flow) in order to smooth out the peak in the third order transconductance.

The semiconductor devices according to embodiments of the present invention may exhibit significantly improved linearity. For example, if the semiconductor device is divided into two regions having different threshold voltage values, the peak third order transconductance value may be reduced on the order of 30% as compared to a device having uniform threshold voltages throughout. If the semiconductor device is divided into three regions having different threshold voltage values, the peak third order transconductance value may be reduced on the order of 65% as compared to a device having uniform threshold voltages throughout. In semiconductor devices having greater variation in the threshold voltage, further reduction of the third order transconductance may be achieved. These improvements in linearity maybe achieved with little impact on the other operating characteristics of the device such as, for example, the gain of the device.

In some example embodiments, semiconductor devices are provided that include a plurality of unit cell transistors that are formed on a common semiconductor structure. The unit cell transistors are electrically connected in parallel, and each unit cell transistor includes a respective gate finger. The threshold voltages of first and second subsets of the unit cell transistors are designed to differ by, for example, at least 0.1 volts in some embodiments. In other embodiments, this difference may be at least 0.25 volts. In further embodiments, this difference may be at least 0.5 volts. In still other embodiments, the difference may be between 0.1-1.25 volts.

In other example embodiments, semiconductor devices are provided that include a plurality of unit cell transistors that are formed on a common semiconductor structure. The unit cell transistors are electrically connected in parallel, and each unit cell transistor includes a respective gate finger. The threshold voltages of first and second segments of at least some of the unit cell transistors are designed to differ by, for example, at least 0.1 volts in some embodiments. In other embodiments, this difference may be at least 0.25 volts or at least 0.5 volts. In still other embodiments, the difference may be between 0.1-1.25 volts.

In still further example embodiments, semiconductor devices are provided that include a plurality of unit cell transistors on a semiconductor structure. The unit cell transistors are electrically connected in parallel, and each unit cell transistor includes a gate finger that extends above a gallium nitride based barrier layer of the semiconductor structure. A thickness of the gallium nitride based barrier layer is different in different locations within the semiconductor device in order to vary the threshold voltage throughout the semiconductor device.

In yet additional example embodiments, semiconductor devices are provided that include a plurality of unit cell transistors on a semiconductor structure. The unit cell transistors are electrically connected in parallel, and each unit cell transistor includes a gate finger that extends above a gallium nitride based barrier layer of the semiconductor structure. The semiconductor devices include a voltage divider that has a first output that is coupled to the gate fingers of a first subset of the unit cell transistors and a second output that is coupled to the gate fingers of a second subset of the unit cell transistors. The first and second outputs are configured to apply first and second voltages to the gate fingers of the first and second subsets of the unit cell transistors, respectively, where the first and second voltages differ by, for example, at least 0.1 volts or by at least 0.25 volts in other embodiments.

Methods of increasing the linearity of a semiconductor device are also provided. Pursuant to these methods, a semiconductor device is formed that includes a plurality of unit cell transistors on a common semiconductor structure. The unit cell transistors are electrically connected in parallel, and each unit cell transistor includes a gate finger. One or more voltage signals are applied to the gate fingers of the unit cell transistors in order to turn on between two and ten different portions of the semiconductor device at respective different degrees.

Embodiments of the present invention will now be described in greater detail with reference to FIGS. 2-17.

Figure 2:
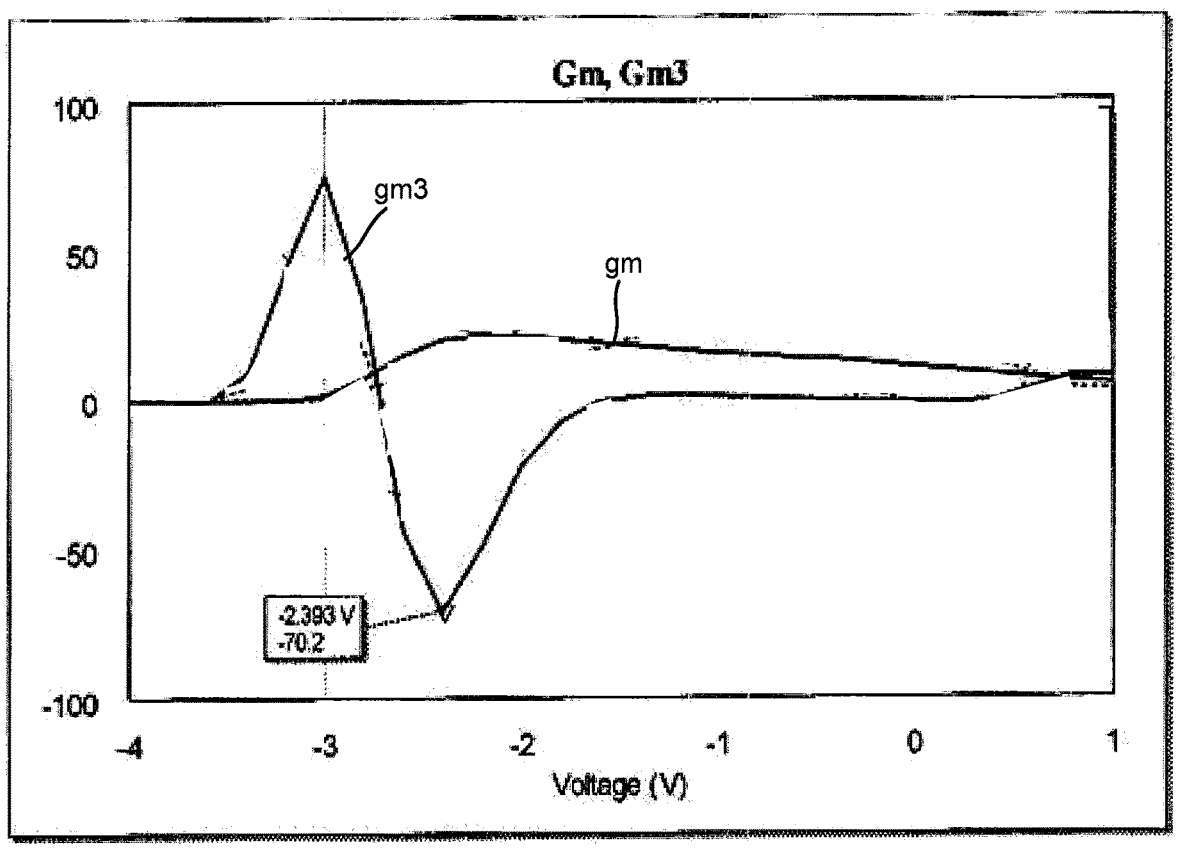
FIG. 2 is a graph illustrating the transconductance and the third order transconductance as a function of the applied threshold voltage for a conventional semiconductor device with unit gate fingers having widths of 125 microns.

FIG. 2 is a graph illustrating the transconductance (gm) and the third order transconductance (gm3) as a function of the gate-to-source voltage differential for a conventional gallium nitride based multi-cell semiconductor device, such as the semiconductor device 10 of FIG. 1. As shown in FIG. 2, the third order transconductance has a high positive peak followed by a high negative peak and then tends to smooth out as the applied gate voltage goes from device turn-on to saturation. Due to the sharp turn-on behavior of gallium nitride based transistors, the third order transconductance peaks near pinch off, which refers to the drain to source voltage level after which the drain to source current becomes almost constant (i.e., where the transistor enters into the saturation region). As can be seen in FIG. 2, the third order transconductance peaks at a value of −70.2 mS/V. As noted above, non-linearities in the third order transconductance may generate third order intermodulation products in the output signal of the device that may degrade the performance of a communications system that includes the device. Consequently, allowable values for third order transconductance are often specified for applications such as various wireless communications applications, and the semiconductor devices suitable for operation in such systems must have peak third order transconductance values that are less than the specified values.

Figure 3:
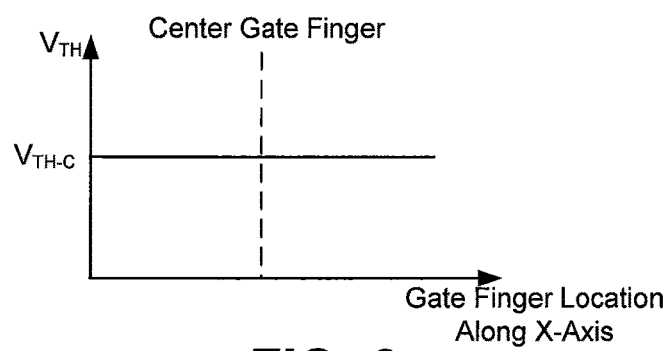
FIG. 3 is a schematic graph illustrating the threshold voltage variation in the conventional multi-cell semiconductor device of FIG. 1.

FIG. 3 is a graph illustrating the threshold voltage variation in a conventional multi-cell semiconductor device having the design of the semiconductor device 10 of FIG. 1.

Referring to FIG. 3, the vertical axis represents the threshold voltage (i.e., the gate-to-source voltage differential at which the unit cell transistors turn on), while the horizontal axis denotes the gate fingers included in the conventional semiconductor device 10, arranged in their order across the device (i.e., arranged in the x-axis direction of FIG. 1). In other words, the left portion of the horizontal axis of FIG. 3 corresponds to the gate fingers 16 on the left side of the semiconductor device 10 of FIG. 1 while the right portion of the horizontal axis of FIG. 3 corresponds to the gate fingers 16 on the right side of the semiconductor device 10 of FIG. 1. Thus, FIG. 3 shows the threshold voltage for each of the unit cell transistors of the semiconductor device 10. As shown in FIG. 3, in the conventional semiconductor device 10, all of the unit cell transistors 40 have the same threshold voltage value $V_{TH-C}$. It should also be noted that in the conventional semiconductor device 10, the threshold voltage value $V_{TH-C}$ is constant along the width of each gate finger 16.

Figure 4A:
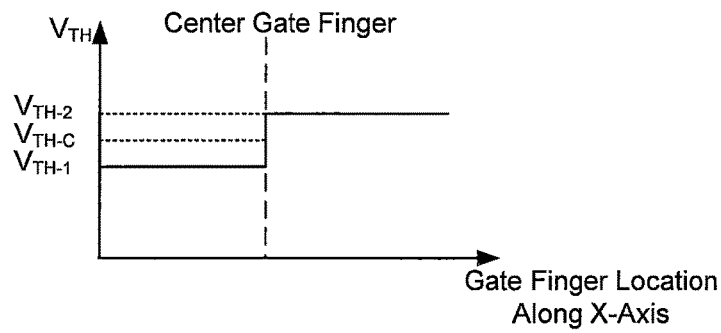
FIGS. 4A-4C are schematic graphs illustrating the threshold voltage variation in multi-cell semiconductor devices according to certain embodiments of the present invention.
Figure 4B:
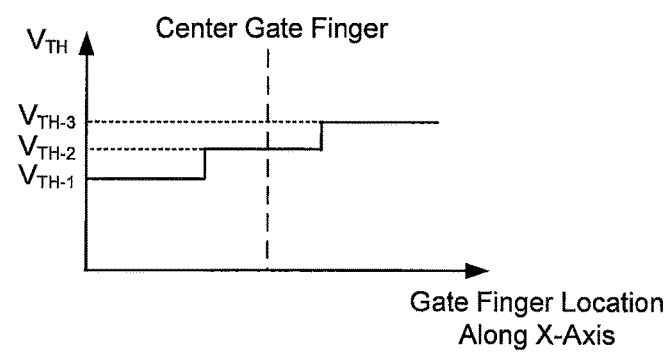
Figure 4C:
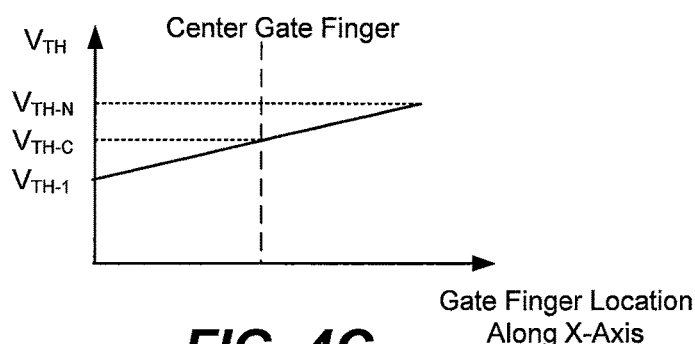

FIGS. 4A-4C are graphs illustrating the threshold voltage variation in multi-cell semiconductor devices according to certain embodiments of the present invention. As with FIG. 3, in FIGS. 4A-4C the horizontal axis denotes the locations of the gate fingers within the transistor along the direction of the x-axis of FIG. 1 (as well as the x-axis direction of FIGS. 5A-5C, which are discussed below), while the vertical axis represents the threshold voltage for the unit cell transistors corresponding to each respective gate finger.

As shown in FIG. 4A, in a first example embodiment, a first subset of the unit cell transistors are designed to have a first threshold voltage value $V_{TH-1}$ and a second subset of the unit cell transistors are designed to have a second threshold voltage value $V_{TH-2}$ that is greater than the first threshold voltage value $V_{TH-1}$. The first threshold voltage value $V_{TH-1}$ may, for example, be lower than $V_{TH-C}$ while the second threshold voltage value $V_{TH-2}$ may, for example, be higher than $V_{TH-C}$. In example embodiments, $V_{TH-2}$-$V_{TH-1}$ may be between 0.1 and 0.8 volts, although embodiments of the present invention are not limited thereto.

Referring next to FIG. 4B, in a second example embodiment, a first subset of the unit cell transistors are designed to have a first threshold voltage value $V_{TH-1}$, a second subset of the unit cell transistors are designed to have a second threshold voltage value $V_{TH-2}$ that is greater than the first second threshold voltage value $V_{TH-1}$, and a third subset of the unit cell transistors are designed to have a third threshold voltage value $V_{TH-3}$ that is greater than the second threshold voltage value $V_{TH-2}$. The first threshold voltage value $V_{TH-1}$ may, for example, be lower than $V_{TH-C}$, the second threshold voltage value $V_{TH-2}$ may, for example, be approximately equal to $V_{TH-C}$, and the third threshold voltage value $V_{TH-3}$ may, for example, be higher than $V_{TH-C}$. In example embodiments, $V_{TH-3}$-$V_{TH-1}$ may be between 0.1 and 0.8 volts, although embodiments of the present invention are not limited thereto. By adding a third discrete threshold voltage value $V_{TH-3}$, the peak value of the third order transconductance at device turn-on may be further reduced by spreading out (smoothing) the device turn-on over a larger range of applied gate voltages.

Referring next to FIG. 4C, in a third example embodiment, each unit cell transistor may have a different threshold voltage value. In particular, the semiconductor device corresponding to FIG. 4C has unit cell transistors having steadily increasing threshold voltage values. Thus, for a semiconductor device having N unit cell transistors, the threshold voltage values may range from $V_{TH-1}$ to $V_{TH-N}$. The threshold voltage value $V_{TH-N/2}$ of the center unit cell transistor may, for example, be approximately equal to $V_{TH-C}$. The design corresponding to FIG. 4C may further spread out when different portions of the device turn on in response to application of a turn-on voltage to a gate pad of the device. The design of the semiconductor device corresponding to FIG. 4C may further reduce the peak value of the third order transconductance at device turn-on.

While FIGS. 4A-4C illustrate that the threshold voltage increases (either continuously or in discrete groups) with increasing unit cell transistor (or equivalently, gate finger position) as you move from left to right across the device (or alternatively, from right to left), it will be appreciated that this need not be the case. For example, FIGS. 10A-10C below illustrate additional example embodiments in which the threshold voltages for different sets of unit cell transistors are more randomly distributed throughout the device.

Figure 5A:
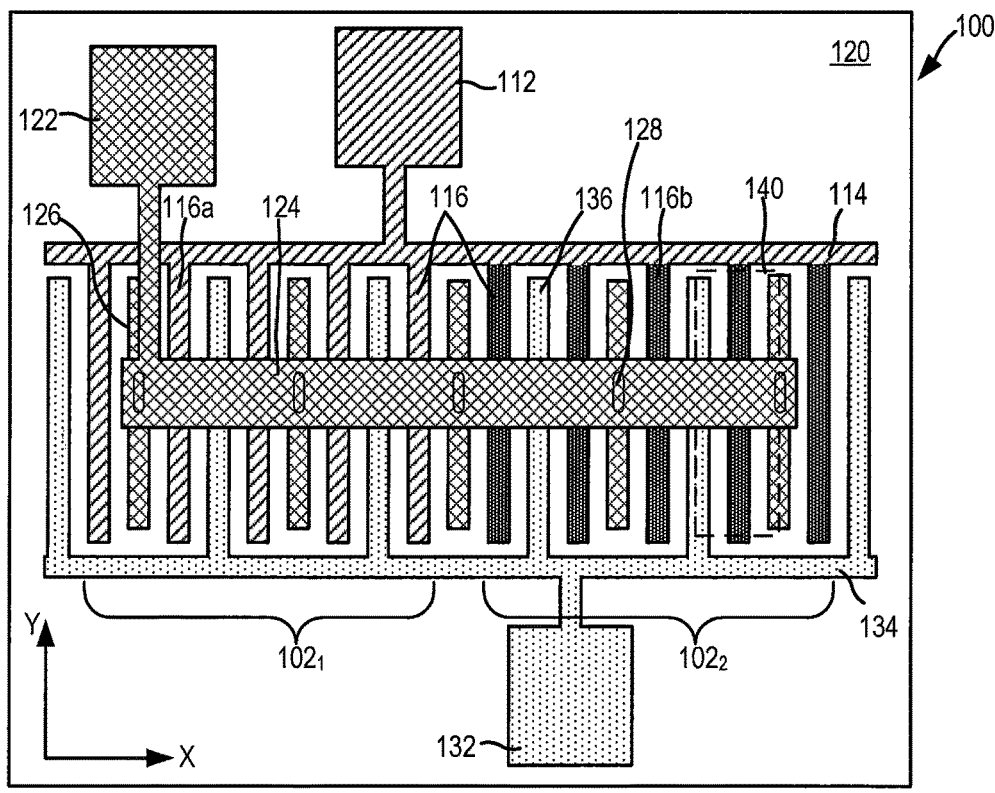
FIGS. 5A-5C are schematic plan views of multi-cell semiconductor devices according to embodiments of the present invention that have gate fingers having different threshold voltages.
Figure 5B:
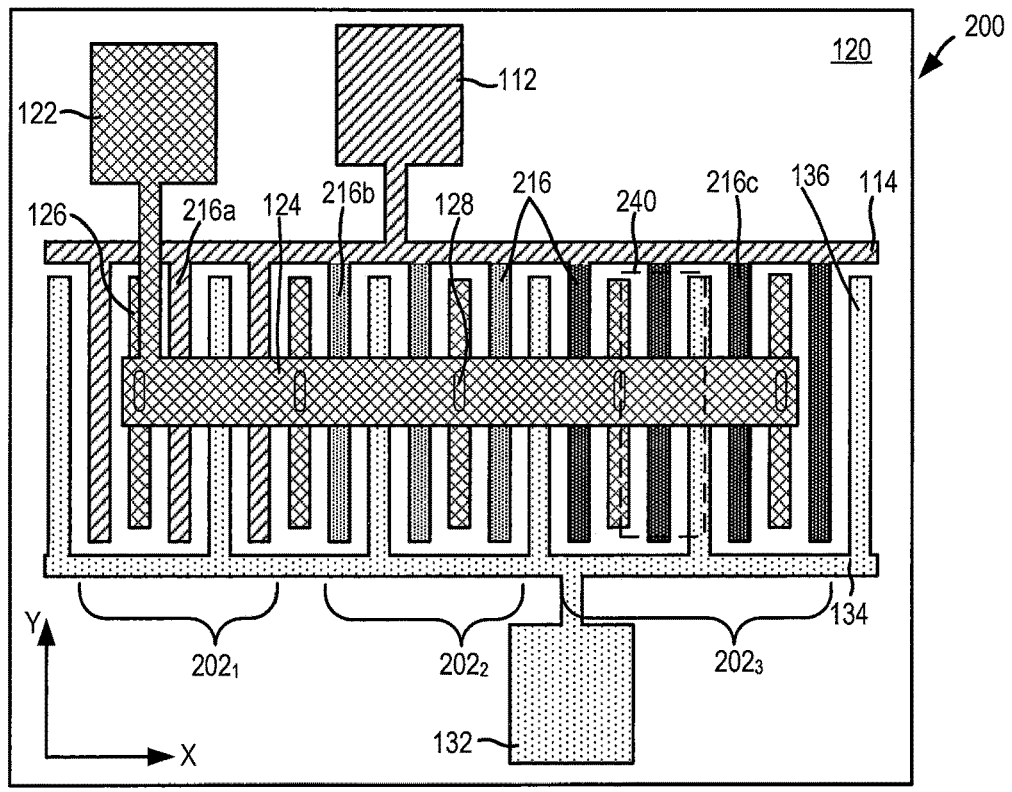
Figure 5C:
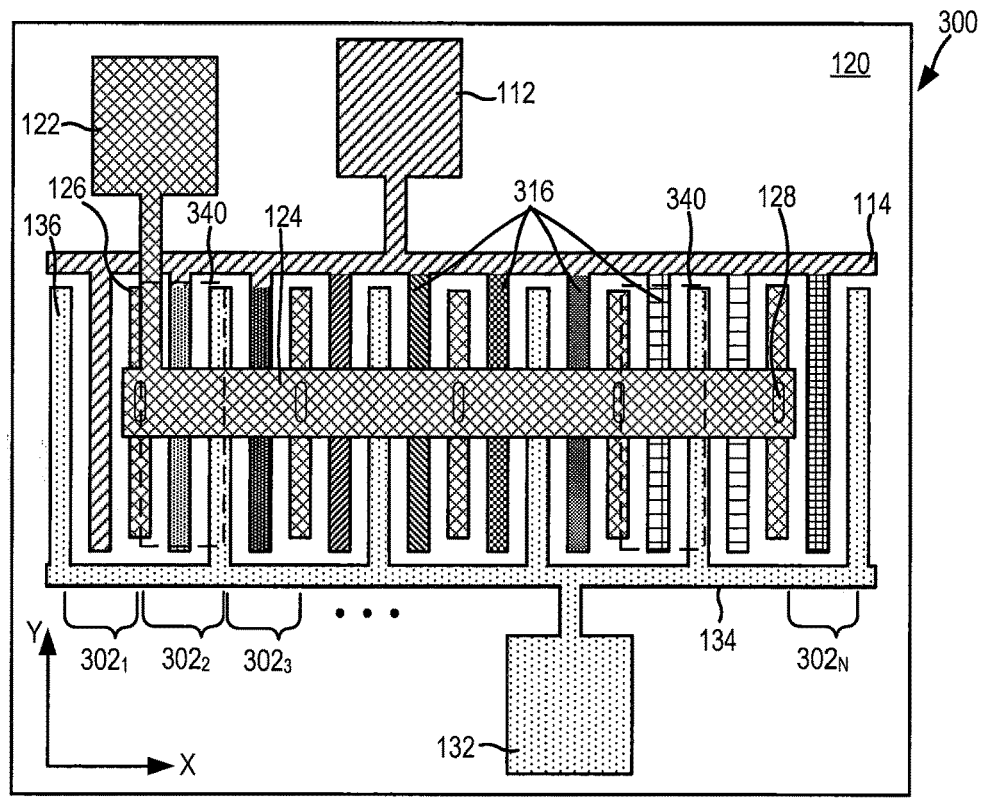

FIGS. 5A-5C are plan views of the metal layouts of three example multi-cell semiconductor devices according to certain embodiments of the present invention. The semiconductor devices of FIGS. 5A-5C correspond to the devices discussed above with reference to FIGS. 4A-4C, respectively.

As shown in FIG. 5A, a multi-cell semiconductor device 100 includes various metal patterns that are formed on a semiconductor structure 120. An example composition of the semiconductor structure 120 will be discussed in greater detail below with reference to FIGS. 8A and 8B. As shown in FIG. 5A, the multi-cell semiconductor device 100 includes a gate pad 112, a source pad 122 and a drain pad 132 that are formed on the semiconductor structure 120. The gate pad 112 is connected by a gate bus 114 to a plurality of gate fingers 116 that extend in parallel in a first direction (the y-direction). The drain pad 132 is connected to a plurality of parallel drain contacts 136 via a drain bus 134. The source pad 122 is connected to a plurality of parallel source contacts 126 via a source bus 124 that may be disposed, for example, at a different metallization layer than the gate bus 114 and the drain bus 134. The source bus 124 in the depicted embodiment runs above the gate fingers 116 and the drain contacts 136. Vertically-extending source contact plugs 128 electrically connect each source contact 126 to the source bus 124. Each gate finger 116 runs along the y-direction between a pair of adjacent source and drain contacts 126, 136. A unit cell of the transistor 100 is illustrated at box 140, and includes a gate finger 116 that extends between adjacent source and drain contacts 126, 136.

As is further shown in FIG. 5A, the gate fingers 116 may include first gate fingers 116a and second gate fingers 116b. The gate fingers 116a may be in a first region $102_1$ of the semiconductor structure 120, and the gate fingers 116b may be in a second region $102_2$ of the semiconductor structure 120. In the first region $102_1$, the unit cell transistors 140 (i.e., the unit cell transistors that include the gate fingers 116a) may each have a first threshold voltage value $V_{TH-1}$ along the width of each gate finger 116a. In the second region $102_2$, the unit cell transistors 140 (i.e., the unit cell transistors that include the gate fingers 116b) may each have a second threshold voltage value $V_{TH-2}$ along the width of each gate finger 116b. The second threshold voltage value $V_{TH-2}$ may be greater than the first threshold voltage value $V_{TH-1}$. As will be discussed below, the unit cell transistors in the first and second regions $102_1$ and $102_2$ may be made to have different threshold voltage values in a variety of ways including using different materials to form the gate fingers or changing the composition, doping concentration and/or thickness of one or more layers that underlie the gate fingers. For ease of description the gate fingers 116a of unit cell transistors having the first threshold voltage value $V_{TH-1}$ are shown using a first form of cross-hatching in FIG. 5A while the gate fingers 116b of unit cell transistors having the second threshold voltage value $V_{TH-2}$ are shown using a second form of cross-hatching. This same convention is also used in the figures depicting additional embodiments of the present invention. It will be appreciated, however, that depending upon the technique used to provide different threshold voltage values the gate fingers (e.g., gate fingers 116a and 116b) may or may not have the same composition.

In some embodiments, $V_{TH-2}$-$V_{TH-1}$ may be at least 0.1 volts. In other embodiments, $V_{TH-2}$-$V_{TH-1}$ may be at least 0.25 volts. In still other embodiments, $V_{TH-2}$-$V_{TH-1}$ may be at least 0.5 volts. In still other embodiments, $V_{TH-2}$-$V_{TH-1}$ may be at least 0.05 volts or be between 0.1-1.25 volts. In contrast, the unit cell transistors that are within a given region (e.g., the first region $102_1$) may each have substantially the same threshold voltage. For example, the unit cell transistors within each region may have threshold voltages that are within 0.025 volts of each other in some embodiments. In other embodiments, the unit cell transistors within each region may have threshold voltages that are within 0.01 volts of each other.

As shown in FIG. 5B, a multi-cell semiconductor device 200 according to further embodiments of the present invention may be similar to the semiconductor device 100 discussed above with reference to FIG. 5A, except that the semiconductor device 200 is divided into three regions $202_1$, $202_2$, $202_3$ instead of two regions as in the case of semiconductor device 100. In the first region $202_1$, unit cell transistors having gate fingers 216a may be disposed that each have a first threshold voltage value $V_{TH-1}$ along the width of each gate finger 216a. In the second region $202_2$, unit cell transistors having gate fingers 216b may be disposed that each have a second threshold voltage value $V_{TH-2}$ along the width of each gate finger 216b, where the second threshold voltage value $V_{TH-2}$ is greater than the first threshold voltage value $V_{TH-1}$. In the third region $202_3$, unit cell transistors having gate fingers 216c may be disposed that each have a third threshold voltage value $V_{TH-3}$ along the width of each gate finger 216c, where the third threshold voltage value $V_{TH-3}$ is greater than the second threshold voltage value $V_{TH-2}$. Elements of semiconductor device 200 that are the same as the corresponding elements of semiconductor device 100 are identified by the same reference numerals and further description of these elements is omitted.

As shown in FIG. 5C, a multi-cell semiconductor device 300 according to still further embodiments of the present invention may be similar to the semiconductor device 100, 200 that are discussed above, except that the semiconductor device 300 is divided into N regions $302_1$, $302_2$, . . . $302_N$ instead of two regions as in the case of device 100 or three regions as in the case of device 200. Each of the N regions $302_1$, $302_2$, . . . $302_N$ includes a single unit cell transistor 340 that has a gate finger 316. Each unit cell transistor 340 may be configured to have a threshold voltage value that is different from the threshold voltage values of all other of the unit cell transistors 340. The threshold voltage values for the unit cell transistors 340 may increase monotonically from left to right in FIG. 5C so that the semiconductor device 300 will have unit cell transistors 340 having threshold voltage values as shown in FIG. 4C that range from $V_{TH\text{-}1}$ to $V_{TH\text{-}N}$. Elements of semiconductor device 300 that are the same as the corresponding elements of semiconductor device 100 are identified by the same reference numerals and further description of these elements is omitted.

FIGS. 4A-4C and 5A-5C illustrate semiconductor device designs where different unit cell transistors have different threshold voltage values in order to provide semiconductor devices 100, 200, 300 that have variable threshold voltages that are different in different locations within the respective devices. In other embodiments, the threshold voltage may instead be made to vary within individual unit cell transistors by configuring the unit cells so that the threshold voltage varies along the gate width of at least some of the individual gate fingers (as noted above, the "width" of a gate finger refers to the distance that the gate finger extends in parallel between the source and drain contacts, and is often longer than the "length" of the gate finger). For example, FIGS. 6A and 6B are plan views of multi-cell semiconductor devices according to further embodiments of the present invention that have threshold voltage values that vary discretely along the width of each gate finger (where, as discussed above, the "width" of the gate finger is the distance that the gate finger extends in the y-direction in the figures).

Figure 6A:
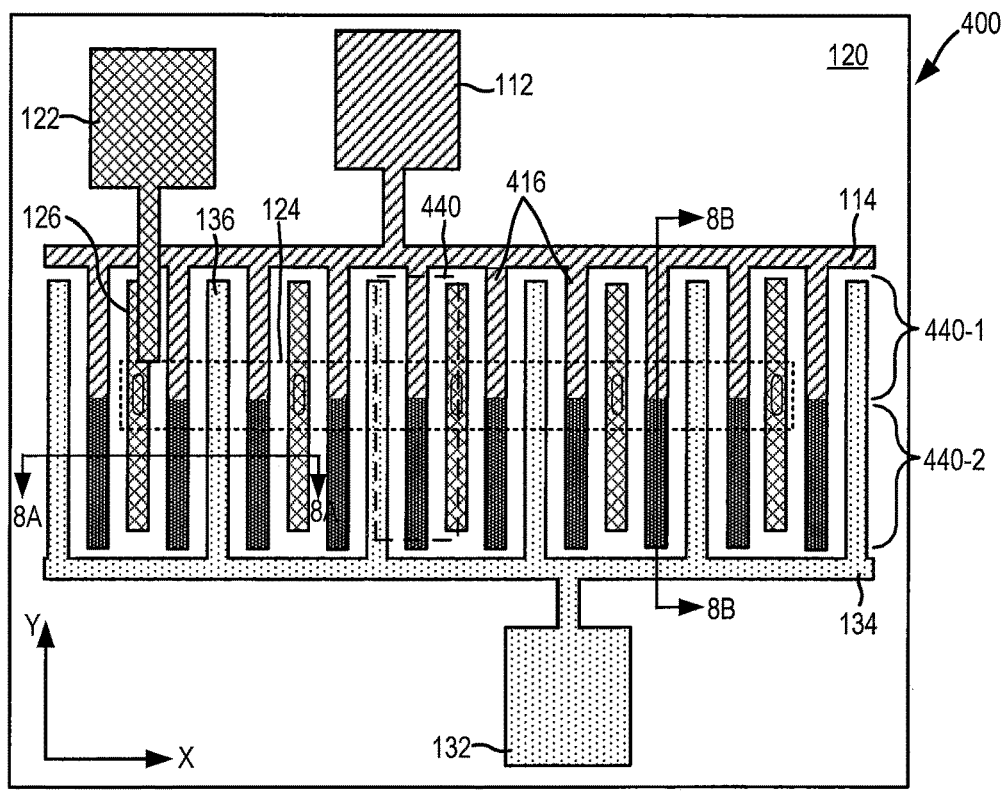
FIGS. 6A and 6B are schematic plan views of multi-cell semiconductor devices according to embodiments of the present invention that have threshold voltages that vary discretely along the width of the gate fingers thereof, with the total width of each gate finger being 125 microns.

In particular, FIG. 6A is a plan view of a multi-cell semiconductor device 400. The semiconductor device 400 is designed to have two different threshold voltage values along the width of each gate finger 416 thereof. In other words, the threshold voltage value may vary within each unit cell transistor 440. In the embodiment of FIG. 4A, a first half 440-1 of each unit cell transistor 440 may have a first threshold voltage value $V_{TH\text{-}1}$ and the second half 440-2 of each unit cell transistor 440 may have a second threshold voltage value $V_{TH\text{-}2}$. In the depicted embodiment, the first half 440-1 of each unit cell transistor 440 is the half closest to the gate bus 114, and the second half 440-2 of each unit cell transistor 440 is the half that is remote from the gate bus 114. The second threshold voltage value $V_{TH\text{-}2}$ may be either less than or greater than the first threshold voltage $V_{TH\text{-}1}$. In FIG. 6A (as well as in the embodiments of FIGS. 6B and 9) the source bus 124 is shown in outline form to reveal the underlying metal layers in better detail.

Figure 6B:
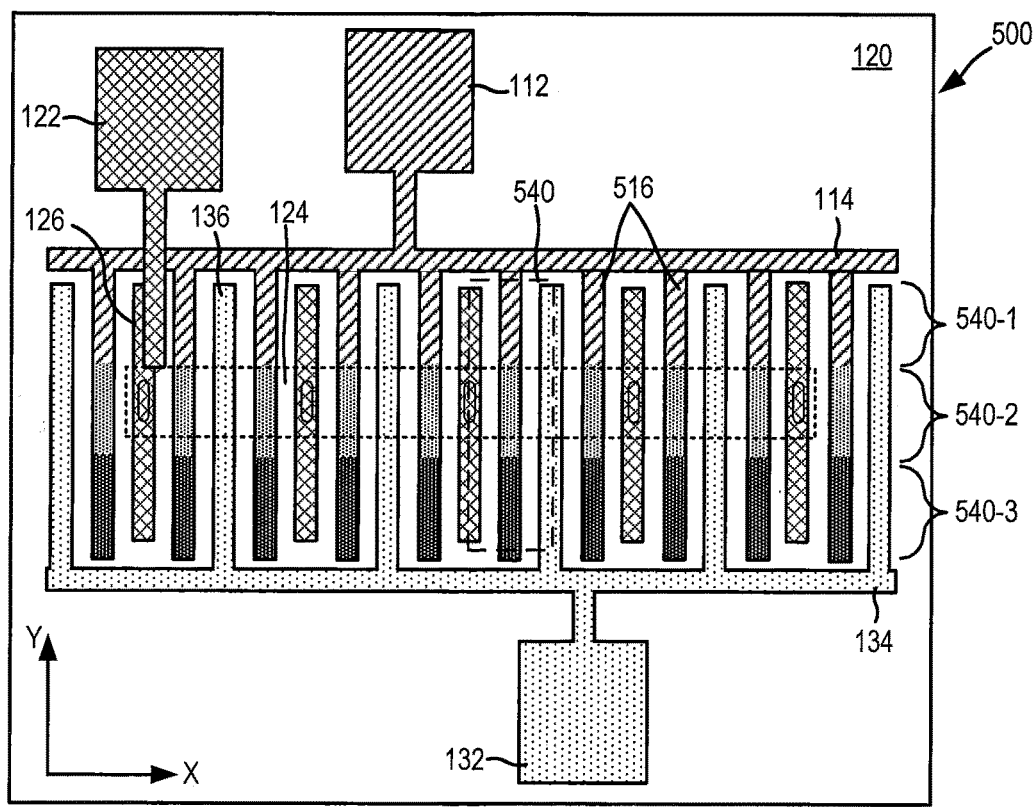

FIG. 6B is a plan view of a multi-cell semiconductor device 500 that has three different threshold voltage values along the width of each gate finger 516 thereof. In particular, an initial third 540-1 of each unit cell transistor 540 may have a first threshold voltage value $V_{TH\text{-}1}$, a middle third 540-2 of each unit cell transistor 540 may have a second threshold voltage value $V_{TH\text{-}2}$, and an end third 540-3 of each unit cell transistor 540 may have a third threshold voltage value $V_{TH\text{-}3}$. The first, second and third threshold voltage values may be different from each other.

Figure 7A:
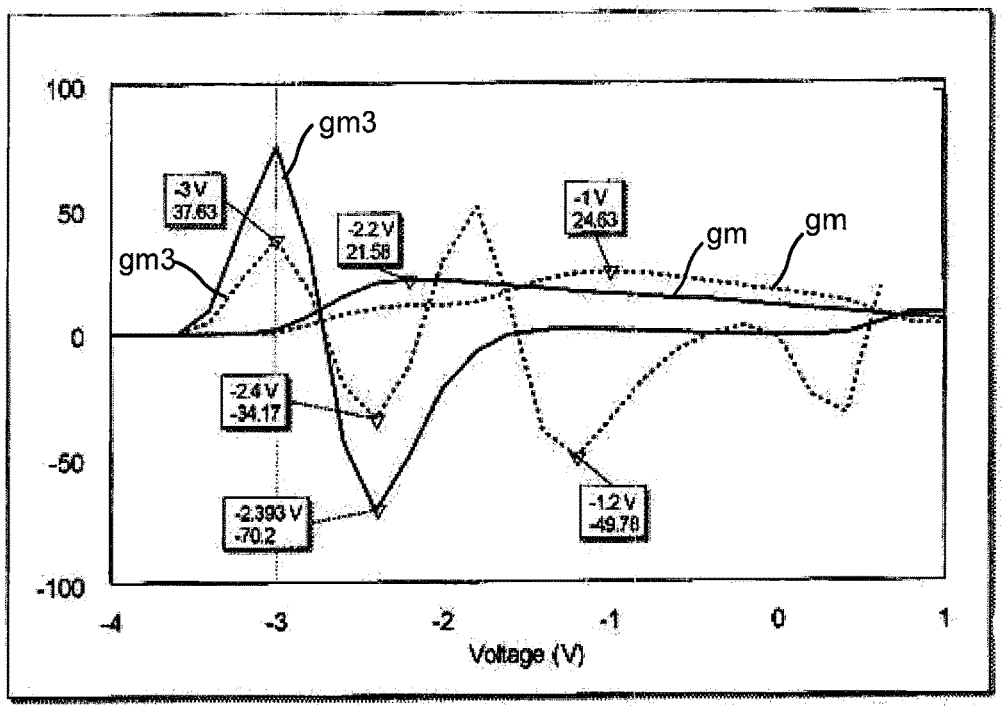
FIGS. 7A-7B are graphs illustrating the transconductance and the third order transconductance as a function of the applied threshold voltage for semiconductor devices having the designs of FIGS. 6A-6B, respectively.
Figure 7B:
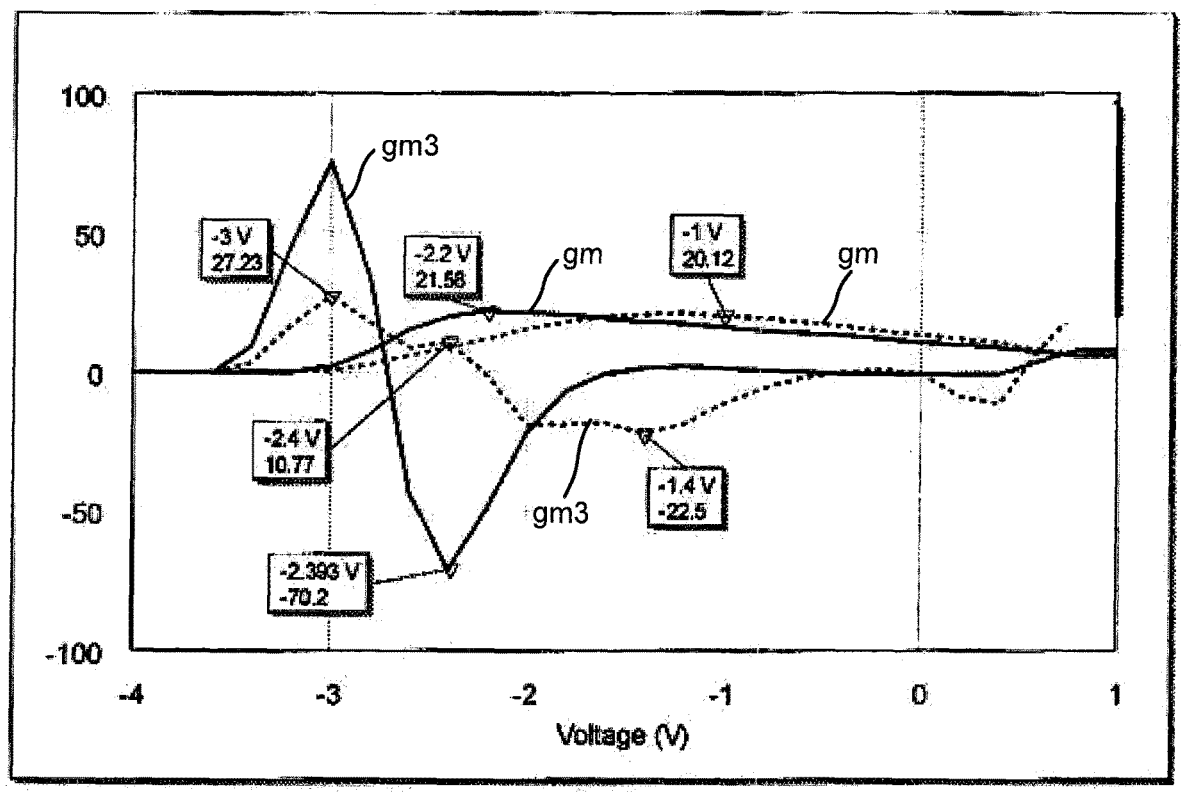

FIGS. 7A-7B are graphs illustrating the transconductance and the third order transconductance as a function of the gate-to-source voltage differential for multi-cell semiconductor devices having the designs discussed above with respect to FIGS. 6A and 6B, respectively (see the dotted lines). The graphs of FIGS. 7A and 7B also include the transconductance and the third order transconductance as a function of the gate-to-source voltage differential for the conventional semiconductor device of FIG. 1 as a point of reference (see the solid lines).

As shown in FIGS. 7A and 7B, the peak value of the third order transconductance may be reduced significantly by varying the threshold voltage along the width of each gate finger. By varying the threshold voltage, different portions of the device may turn-on at different applied gate voltages. As a result the device may have improved linearity. As shown, the more discrete levels of threshold voltage provided within the device the greater the improvement in the reduction in the third order transconductance. In particular, the conventional semiconductor device exhibited a peak third order transconductance value of −70.2. As shown in FIG. 7A, by designing the device to have two different threshold voltage values in different regions thereof, the peak third order transconductance value is reduced to −49.78, or by about 30%. As shown in FIG. 7B, by designing the device to have three different threshold voltage values in different regions thereof, the peak third order transconductance value is reduced to −22.5, or by about 67%. In each case, the non-linearities in the third order transconductance extends over a greater voltage range, but the peak value, which is what generally creates issues, may be substantially reduced.

Figure 8A:
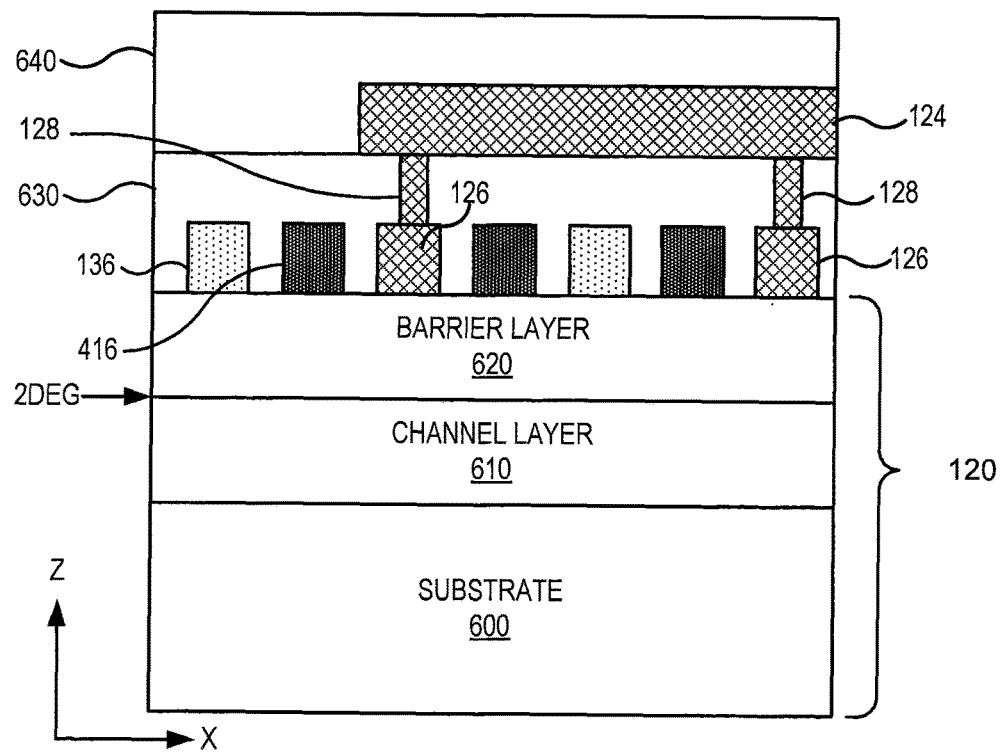
FIG. 8A is a cross-sectional view taken along line 8A-8A of FIG. 6A.

FIG. 8A is a cross-sectional diagram taken along line 8A-8A of FIG. 6A that shows a portion of a cross-section of the multi-cell semiconductor device 400. The semiconductor device 400 includes a semiconductor structure 120 including a substrate 600, which may, for example, include 4H-SiC or 6H-SiC. A channel layer 610 is formed on the substrate 600, and a barrier layer 620 is formed on the channel layer 610. The channel layer 610 and the barrier layer 620 may include Group III-nitride based materials, with the material of the barrier layer 620 having a higher bandgap than the material of the channel layer 610. For example, the channel layer 610 may comprise GaN, while the barrier layer 620 may comprise AlGaN. In some embodiments, either or both the channel layer 610 and the barrier layer 620 may not be intentionally doped layers. The channel layer 610 and the barrier layer 620 may have the same conductivity type (e.g., n-type). As shown in FIG. 8A, the metal contact structures including the gate fingers 416, the source contacts 126, the drain contacts 136, the source bus 124 and the source contact plugs 128 may be formed in one or more interlayer insulating layers 630, 640 that are formed on the barrier layer 620, as may the other metal contact structures shown in FIG. 6A. The interlayer insulating layers 630, 640 may include a dielectric material, such as SiN, $SiO_2$, etc.

Due to the difference in bandgap between the barrier layer 620 and the channel layer 610 and piezoelectric effects at the interface between the barrier layer 620 and the channel layer 610, a two dimensional electron gas (2DEG) is induced in the channel layer 610 at a junction between the channel layer 610 and the barrier layer 620. The 2DEG acts as a highly conductive layer that allows conduction between the source and drain regions of the device that are beneath a source contact segment 126 and a drain contact 136, respectively.

The source contact 126 and the drain contact 136 are formed on the barrier layer 620. A gate finger 416 is formed on the barrier layer 620 between the drain contact 136 and the source contact 126. The source bus 124 extends over the source contacts 126, drain contacts 136 and gate fingers 416. The source contacts 126 physically and electrically connect to the source bus 124 through respective vertical contact plugs 128 that penetrate the first interlayer insulating layer 630.

The material of the gate fingers 416 may be chosen based on the composition of the barrier layer 620. In certain embodiments, conventional materials capable of making a Schottky contact to a nitride based semiconductor material may be used, such as Ni, Pt, $NiSi_x$, Cu, Pd, Cr, W and/or WSiN. The drain contacts 136 and source contacts 126 may, for example, include a metal, such as TiAlN, that can form an ohmic contact to GaN and/or AlGaN.

While cross-sectional diagrams are not provided for various of the other semiconductor devices according to embodiments of the present invention that are disclosed herein, it will be appreciated that each of those devices may have the same general semiconductor structure 120 as shown in FIG. 8A. Particular embodiments may have specific variations, such as changes in doping concentrations or recesses in the barrier layer 620, as described herein. It will also be appreciated that any of the disclosed embodiments may include additional layers such as, for example, buffer layers or the like that are not shown in FIG. 8A.

Figure 8B:
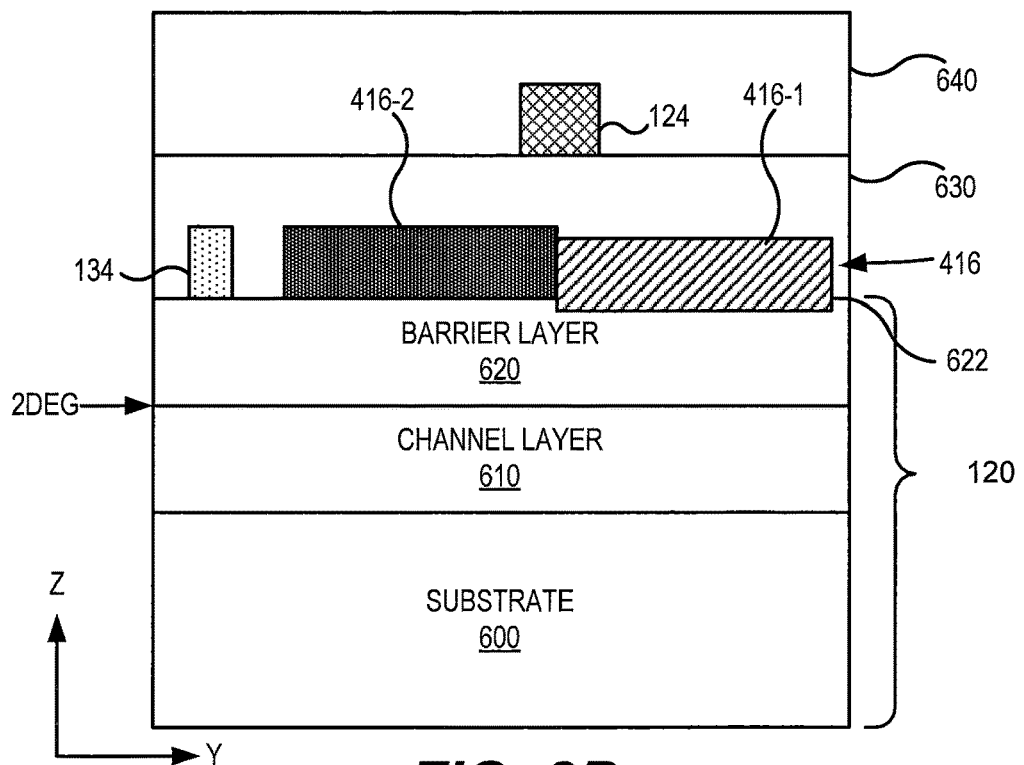
FIG. 8B is a cross-sectional view taken along line 8B-8B of FIG. 6A.

FIG. 8B is a cross-sectional diagram taken along line 8B-8B of FIG. 6A that shows a cross-section of the multi-cell semiconductor device 400 of FIG. 6A taken in the y-direction. The semiconductor device 400 includes the above-described semiconductor structure 120 that includes a substrate 600, a channel layer 610, and a barrier layer 620. The gate finger 416 extends along the semiconductor structure in the y-direction. As shown in FIG. 8B, the upper surface of the barrier layer 620 may be recessed on the right side of the semiconductor structure 120. The gate finger 416 may have a consistent thickness in the z-direction. However, because of the recess 622 in the barrier layer 620, a height of the bottom surface of the first half 416-1 of gate finger 416 may be closer to the channel layer 610 than is a bottom surface of the second half 416-2 of gate finger 416. As a result, the threshold voltage value $V_{TH-1}$ for the first half 416-1 of each gate finger 416 may be less than the threshold voltage value $V_{TH-2}$ for the second half 416-2 of each gate finger 416.

The barrier layer 620 may be recessed so that a top surface of the portion of the barrier layer 620 that is under the first half 416-1 of each gate finger 416 may be lower in the z-direction than the top surface of the portion of the barrier layer 620 that is under the second half 416-2 of each gate finger 416 by, for example, between 1 and 15 nm. This distance may be referred to herein as the "depth" of the recess 622. The depth of the recess 622 may be chosen to obtain a desired amount of difference between the first and second threshold voltage values $V_{TH-1}$, $V_{TH-2}$.

Figure 9:
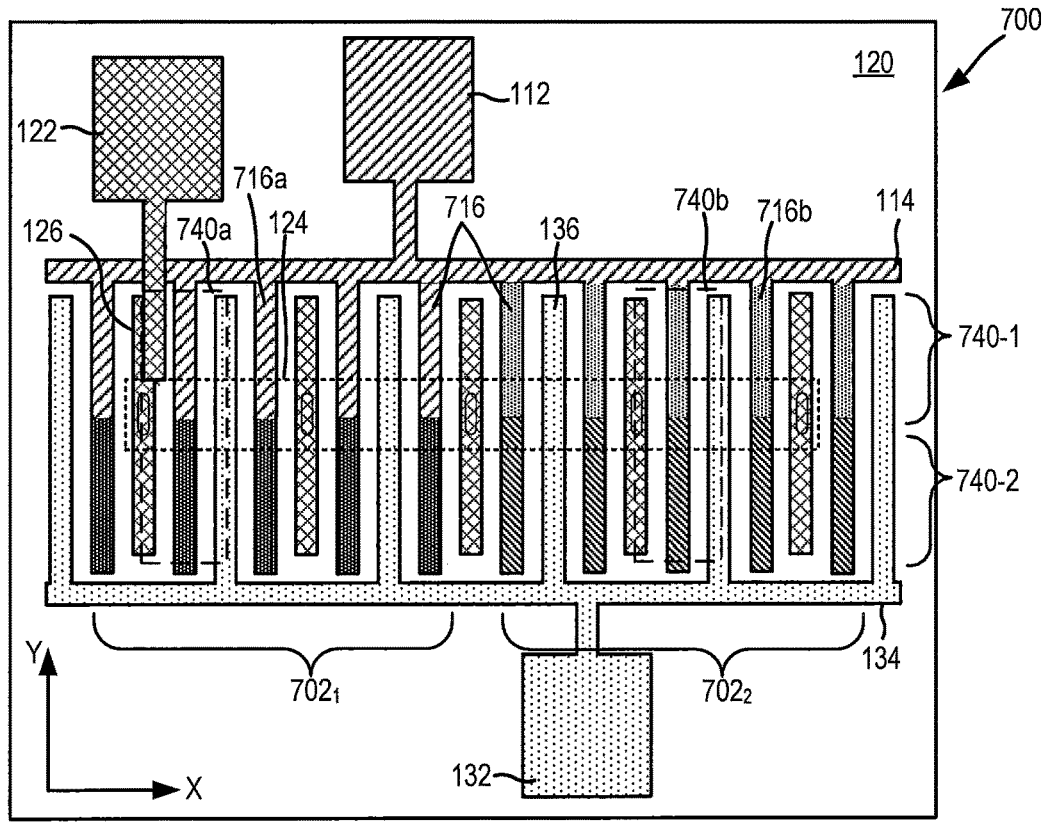
FIG. 9 is a schematic plan view of a multi-cell semiconductor device according to further embodiments of the present invention.

FIG. 9 is a schematic plan view of a multi-cell semiconductor device 700 according to further embodiments of the present invention. The semiconductor device 700 combines aspects of the semiconductor device 100 of FIG. 5A and the semiconductor device 400 of FIG. 6A. As shown in FIG. 9, the semiconductor device 700 includes a plurality of gate fingers 716. The gate fingers 716 may include first gate fingers 716a and second gate fingers 716b. The gate fingers 716a may be in a first region $702_1$ of the semiconductor structure 120, and the gate fingers 716b may be in a second region $702_2$ of the semiconductor structure 120. The gate fingers 716a may each be part of a unit cell transistor 740a, and the gate fingers 716b may each be part of a unit cell transistor 740b. Each unit cell transistor 740a is designed to have two different threshold voltage values along the width thereof. In particular, a first half 740-1 of each unit cell transistor 740a may have a first threshold voltage value $V_{TH-1}$ and the second half 740-2 of each unit cell transistor 740a may have a second threshold voltage value $V_{TH-2}$.

In the second region $702_2$, each unit cell transistor 740b is similarly designed to have two different threshold voltage values along the width thereof. In particular, a first half 740-1 of each unit cell transistor 740b may have a third threshold voltage value $V_{TH-3}$ and the second half 740-2 of each unit cell transistor 740b may have a fourth threshold voltage value $V_{TH-4}$. The first through fourth threshold voltage values $V_{TH-1}$ through $V_{TH-4}$ may comprise different threshold voltage values.

It will be appreciated that which particular unit cell transistors, and/or portions thereof, that have the different threshold voltage values may be arbitrarily selected. Thus, while the graphs of FIGS. 4A-4C and the plan views of FIGS. 5A-5C, 6A-6B and 9 illustrate multi-cell semiconductor devices that have unit cell transistors with threshold voltages that monotonically increase (either discretely or continuously) along the x-direction in the figures, embodiments of the present invention are not limited thereto. This is shown schematically with reference to FIGS. 10A-10C, which are schematic graphs illustrating the threshold voltage variation in multi-cell semiconductor devices according to further embodiments of the present invention.

Figure 10A:
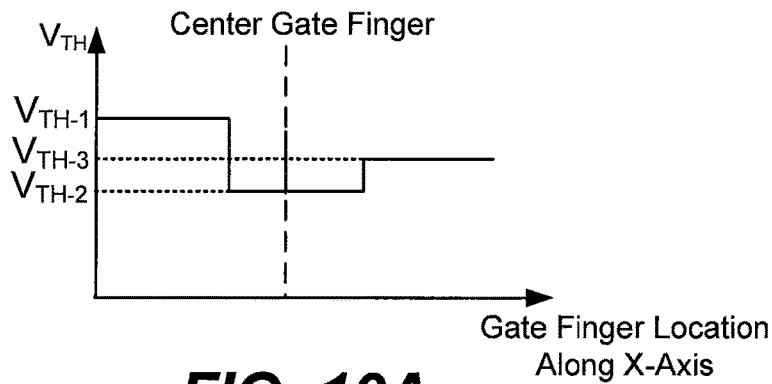
FIGS. 10A-10C are schematic graphs illustrating the threshold voltage variation in multi-cell transistors according to further embodiments of the present invention.

As shown in FIG. 10A, in an example embodiment, a first subset of the unit cell transistors are designed to have a first threshold voltage value $V_{TH-1}$, a second subset of the unit cell transistors are designed to have a second threshold voltage value $V_{TH-2}$, and a third subset of the unit cell transistors are designed to have a third threshold voltage value $V_{TH-3}$. The first subset of the unit cell transistors is on the left hand side of the transistor, the second subset of the unit cell transistors is in the middle of the transistor, and the third subset of the unit cell transistors is on the right hand side of the transistor. As shown in FIG. 10A, the first threshold voltage value $V_{TH-1}$ is the highest value, the second threshold voltage value $V_{TH-2}$ is the lowest threshold voltage value, and the third threshold voltage value $V_{TH-3}$ is an intermediate threshold voltage value.

Figure 10B:
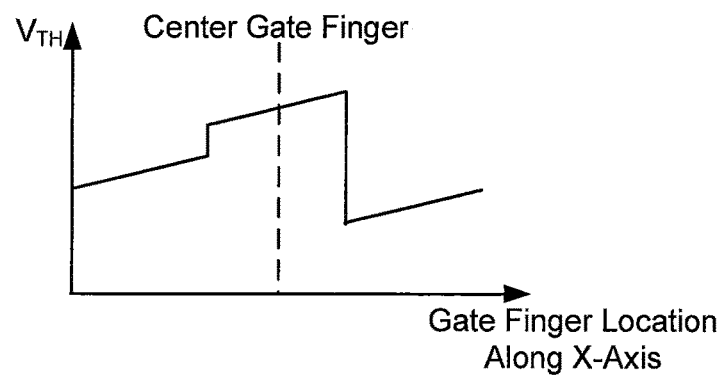

Referring next to FIG. 10B, it can be seen that in another example embodiment, a similar approach may be taken in a multi-cell semiconductor device in which every unit cell transistors has a different threshold voltage value. In the embodiment of FIG. 10B, the unit cell transistors are divided into three subsets of adjacent unit cell transistors, where each subset of unit cell transistors has monotonically increasing threshold voltage values. While FIG. 10B shows that the unit cell transistors may be divided into three subsets of adjacent unit cell transistors, it will be appreciated that more or fewer subsets may be provided.

Figure 10C:
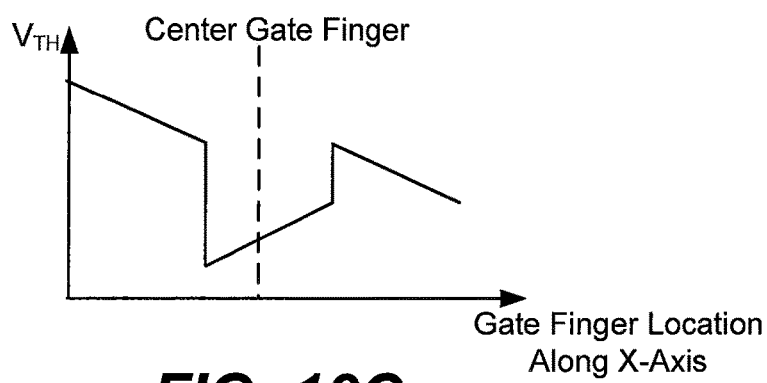

Referring next to FIG. 10C, in yet another example embodiment, a multi-cell semiconductor device may have subsets of adjacent unit cell transistors that have monotonically increasing threshold voltage values as well as subsets of adjacent unit cell transistors that have monotonically decreasing threshold voltage values.

It will be appreciated that FIGS. 10A-10C show three of many possible designs. In the extreme, a semiconductor device may have a large number of unit cell transistors (e.g., 100), each of which has a different threshold voltage value, where the unit cell transistors are randomly distributed throughout the device. It will also be appreciated that the same sorts of variation may be done along the width of each unit cell transistor.

As discussed above with reference to FIG. 8B, one technique for varying the threshold voltage in different regions of the transistors according to embodiments of the present invention is to change the thickness of the barrier layer under portions of some or all of the gate fingers. This technique may be used, for example, to form the semiconductor devices 400 and 500 of FIGS. 6A and 6B, respectively. Similarly, the thickness of the barrier layer may be varied underneath different subsets of the unit cell transistors. Such a technique may be used to form the semiconductor devices 100, 200 and 300 of FIGS. 5A-5C, respectively. These two techniques may be combined to form the semiconductor device 700 of FIG. 9. It will be appreciated, however, that other techniques may be used to vary the threshold voltage in different regions of the semiconductor devices according to embodiments of the present invention.

Figure 11A:
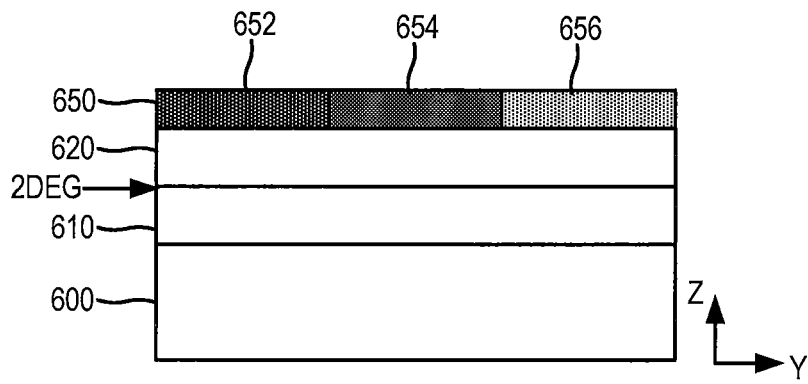
FIGS. 11A-11C are schematic cross-sectional views of multi-cell semiconductor devices according to further embodiments of the present invention.

For example, referring to FIG. 11A, according to further embodiments of the present invention, the threshold voltage may be varied by using different metals or metal alloys to form different gate fingers and/or different portions of the same gate finger 650. As shown in FIG. 11A, a gate finger 650 is formed on the barrier layer 620. The gate finger 650 extends along the y-direction, and is formed using three different metals or metal alloys 652, 654, 656. The different metals may be selected to achieve a desired variation in the threshold voltages under the three different sections of the gate finger 650.

Figure 11B:
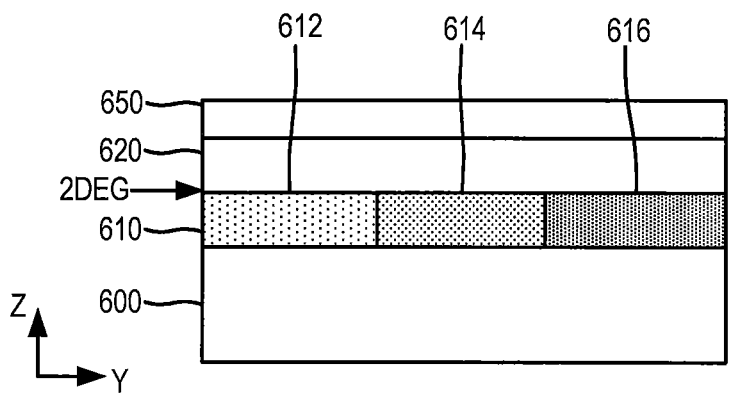

Referring next to FIG. 11B, in another approach, portions of the channel layer 610 may be doped to change the threshold voltage under different portions of the gate fingers 650. As shown in FIG. 11B, portions 612, 614, 616 of the channel layer 610 that are under different portions of one or more of the gate fingers 650 may have different dopant concentrations. The doping concentrations (e.g., n-type dopants which may be, for example, silicon if the channel layer 610 comprises a gallium nitride based channel layer) may be selected to achieve a desired variation in the threshold voltages under the three different sections of the gate finger 650. In some embodiments, p-type dopants could be used instead or a combination of n-type dopants in some portions and p-type dopants in other portions. It may be possible to achieve the same effect by doping sections of the barrier layer 620.

Figure 11C:
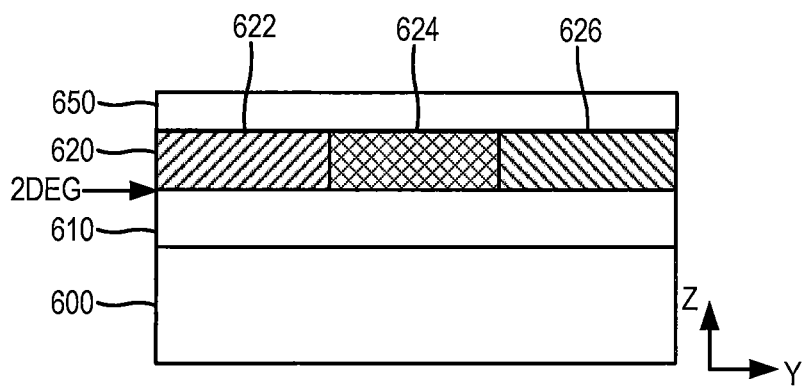

Referring to FIG. 11C, in yet another approach, different portions of the barrier layer 620 may have different material compositions. For example, the barrier layer may comprise an $Al_xGa_{1-x}N$ layer. The value of "x" may be different in each of various portions 622, 624, 626 of the barrier layer 620 that are under different portions of the gate fingers 650 in order to vary the threshold voltage value.

While, FIGS. 8A and 11A-11C show several example ways for varying the threshold voltage in different regions of a multi-gate finger transistor, it will be appreciated that embodiments of the present invention are not limited to these techniques. For example, in yet another approach, insulating layers having different thicknesses may be formed between the barrier layer between respective subsets of the gate fingers to provide unit cell transistors having different threshold voltage values. The same technique may be used along the width of the gate fingers to provide unit cell transistors that have varied threshold voltage values.

Figure 12:
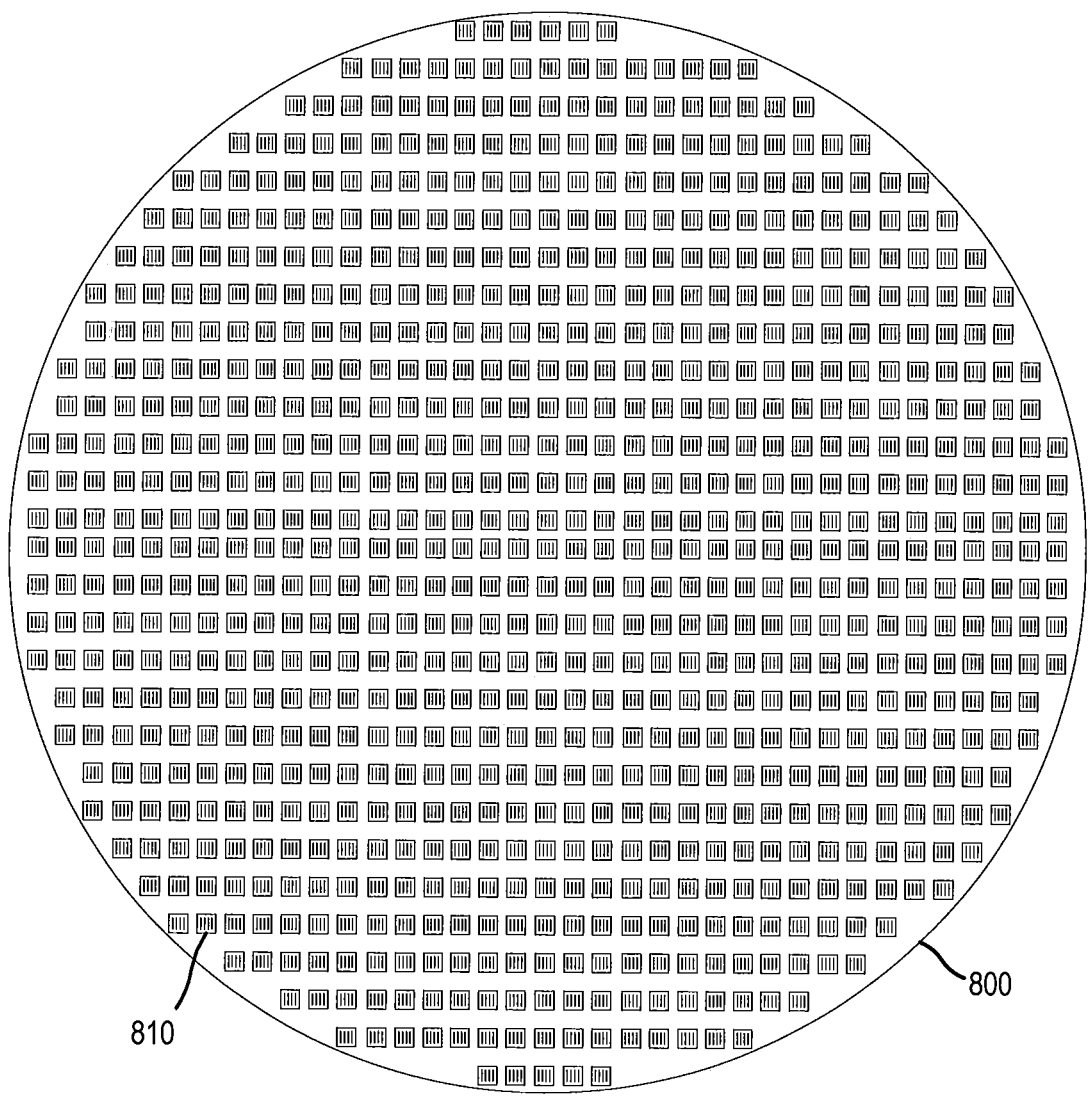
FIG. 12 is a schematic plan view of a semiconductor wafer having a plurality of semiconductor devices according to embodiments of the present invention formed thereon.

Referring next to FIG. 12, a semiconductor wafer 800 is schematically illustrated that includes a plurality of multi-cell semiconductor devices 810 formed thereon. As shown in FIG. 12, a large number of multi-cell semiconductor devices 810 may be formed on wafer 800. In the depicted embodiment, approximately forty multi-cell semiconductor devices 810 fit along the diameter of the wafer 800. More or fewer multi-cell semiconductor devices 810 may be provided. Moreover, while the individual multi-cell semiconductor devices 810 are illustrated in FIG. 12 as being square, it will be appreciated that more commonly each multi-cell semiconductor devices has a generally rectangular shape, with the length of adjacent sides varying by perhaps a factor of ten in example embodiments.

Due to variations in semiconductor growth and processing techniques, there typically is some variation in the threshold voltage across a semiconductor wafer. For example, a typical variation may be in the range of 0.1 to 0.4 volts. However, given the large number of multi-cell semiconductor devices 810 formed on the wafer 800, the variation in threshold voltage due to processing variations within the footprint of any particular multi-cell semiconductor device will be much smaller, such as in the range of 0.0001 to 0.0004 volts. Such small variations do essentially nothing to spread out the device turn-on. As discussed above, pursuant to embodiments of the present invention, larger variations in the threshold voltage values may be deliberately engineered into the device design, such as variations on the order of 0.05 to 1.0 volts. Such variations may be used to spread out the threshold voltages over which different portions of a multi-cell semiconductor device turn on, thereby significantly lowering the peak third order transconductance values in order to provide improved linearity.

Figure 13:
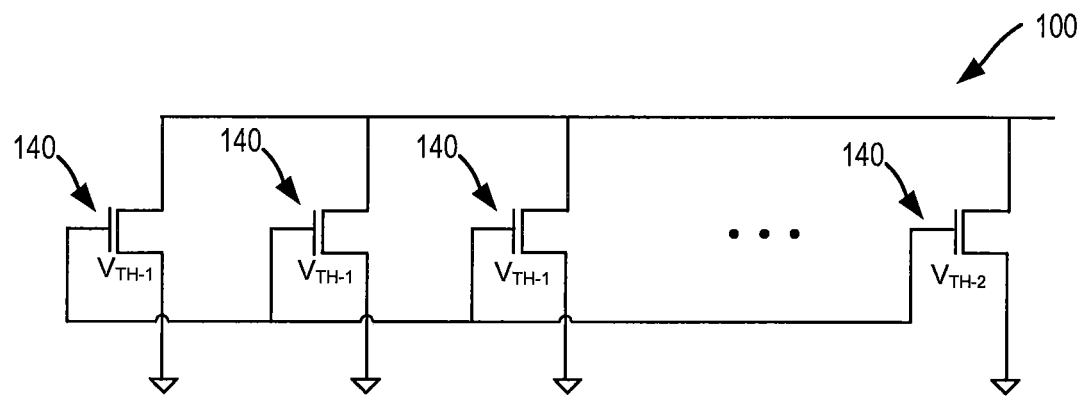
FIG. 13 is a circuit diagram of a multi-cell semiconductor device according to some embodiments of the present invention.

FIG. 13 is a schematic circuit diagram of the multi-cell semiconductor device 100 of FIG. 5A. As shown in FIG. 13, the semiconductor device 100 includes a plurality of unit cell transistors 140. The unit cell transistors 140 are electrically connected in parallel. A first subset of the unit cell transistors 140 may have a first threshold voltage value $V_{TH-1}$ while a second subset of the unit cell transistors 140 may have a second threshold voltage value $V_{TH-2}$ that is different than the first threshold voltage value $V_{TH-1}$.

Figure 14:
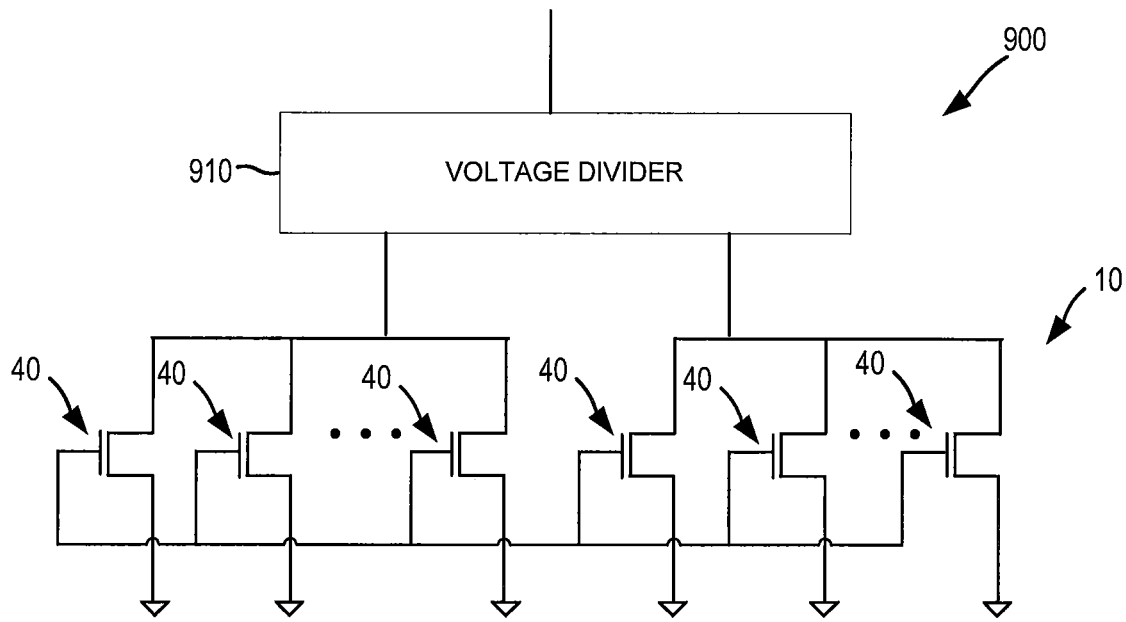
FIG. 14 is a circuit diagram of a multi-cell semiconductor device according to further embodiments of the present invention.

While engineering the threshold voltage is one way of improving the linearity of a multi-cell semiconductor device, it will be appreciated that the same effect may be achieved by applying different gate voltages to different portions of the device. FIG. 14 schematically illustrates this approach.

In particular, as shown in FIG. 14, according to further embodiments of the present invention, different threshold voltages may be applied to different portions of a semiconductor device in order to smooth out the third order transconductance at device turn-on in order to provide improved linearity. As shown in FIG. 14, a semiconductor device 900 according to embodiments of the present invention may include a conventional semiconductor device such as the semiconductor device 10 of FIG. 1. As described above with reference to FIG. 1, and as shown in circuit diagram format in FIG. 14, the conventional semiconductor device 10 may include a plurality of unit cell transistors 40 that are formed on a common semiconductor structure and that are electrically connected in parallel. Each unit cell transistor 40 may include a gate finger. The threshold voltage may be the same along the width of each gate finger, and each unit cell transistor 40 may have the same threshold voltage.

As described above, the conventional semiconductor device 10 may exhibit large third order transconductance values at device turn-on as all of the unit cell transistors 40 will turn on to the same degree in response to application of a threshold voltage. In order to avoid this, the semiconductor device 900 further includes a voltage divider circuit 910. The voltage divider circuit 910 may receive a voltage signal at an input thereof and may output a plurality of output voltage signals in response thereto. Each output voltage signal may have a different value. In the depicted embodiment, the voltage divider 910 has two outputs, but the voltage divider 910 may have more than two outputs in other embodiments.

As is also shown in FIG. 14, each output of the voltage divider 910 may be coupled to a subset of the unit cell transistors 40 and applied to the gate fingers thereof. Thus, the gate fingers of a first subset of the unit cell transistors 40 receive the first output voltage signal from the voltage divider 910, and the gate fingers of a second subset of the unit cell transistors 40 receive the second output voltage signal from the voltage divider 910. The first and second output voltage signals of the voltage divider 910 may differ, for example, by at least 0.1 volts. In some embodiments, the first and second output voltage signals of the voltage divider 910 may differ, for example, by at least 0.25 volts. In other embodiments, the first and second output voltage signals of the voltage divider 910 may differ, for example, by at least 0.5 volts. In still other embodiments, the first and second output voltage signals of the voltage divider 910 may differ, for example, by between 0.1 and 1.25 volts. Since the gate fingers of he first and second subsets of unit cell transistors 40 receive different voltages, the unit cell transistors 40 in these subsets may turn on at different degrees. As described above, by spreading the turn-on voltage for various groups of unit cell transistors, the peak third order transconductance value may be reduced. If the voltage divider 910 has more than two outputs, then the unit cell transistors 40 of semiconductor device 10 may be divided into more than two subgroups, with each subgroup receiving one of the outputs of the voltage divider.

Figure 15:
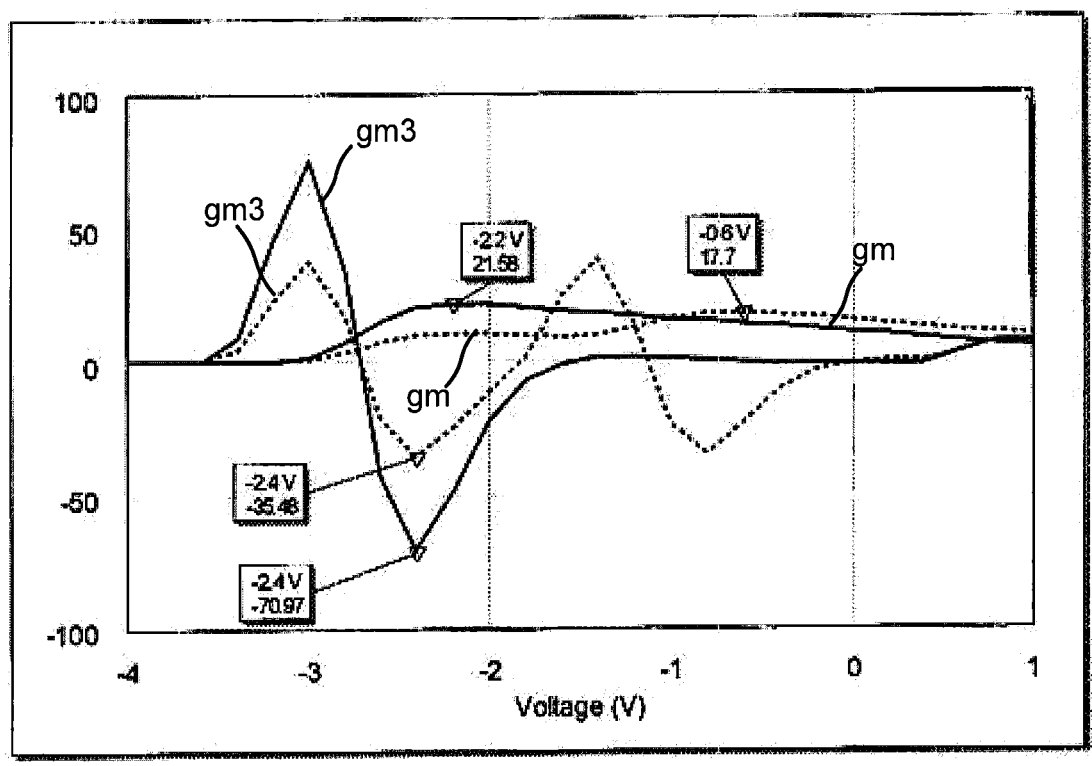
FIG. 15 is a graph illustrating the transconductance and the third order transconductance as a function of the applied threshold voltage for a semiconductor device having the design of FIG. 14 and gate fingers having a total width of 125 microns.

FIG. 15 is a graph illustrating the transconductance and the third order transconductance as a function of the applied threshold voltage for the semiconductor device 900 of FIG. 14 (the dotted lines in FIG. 15) as compared to a conventional device (the solid lines in FIG. 15). As shown in FIG. 15, the peak third order transconductance value is reduced in half as compared to the conventional device.

Figure 16:
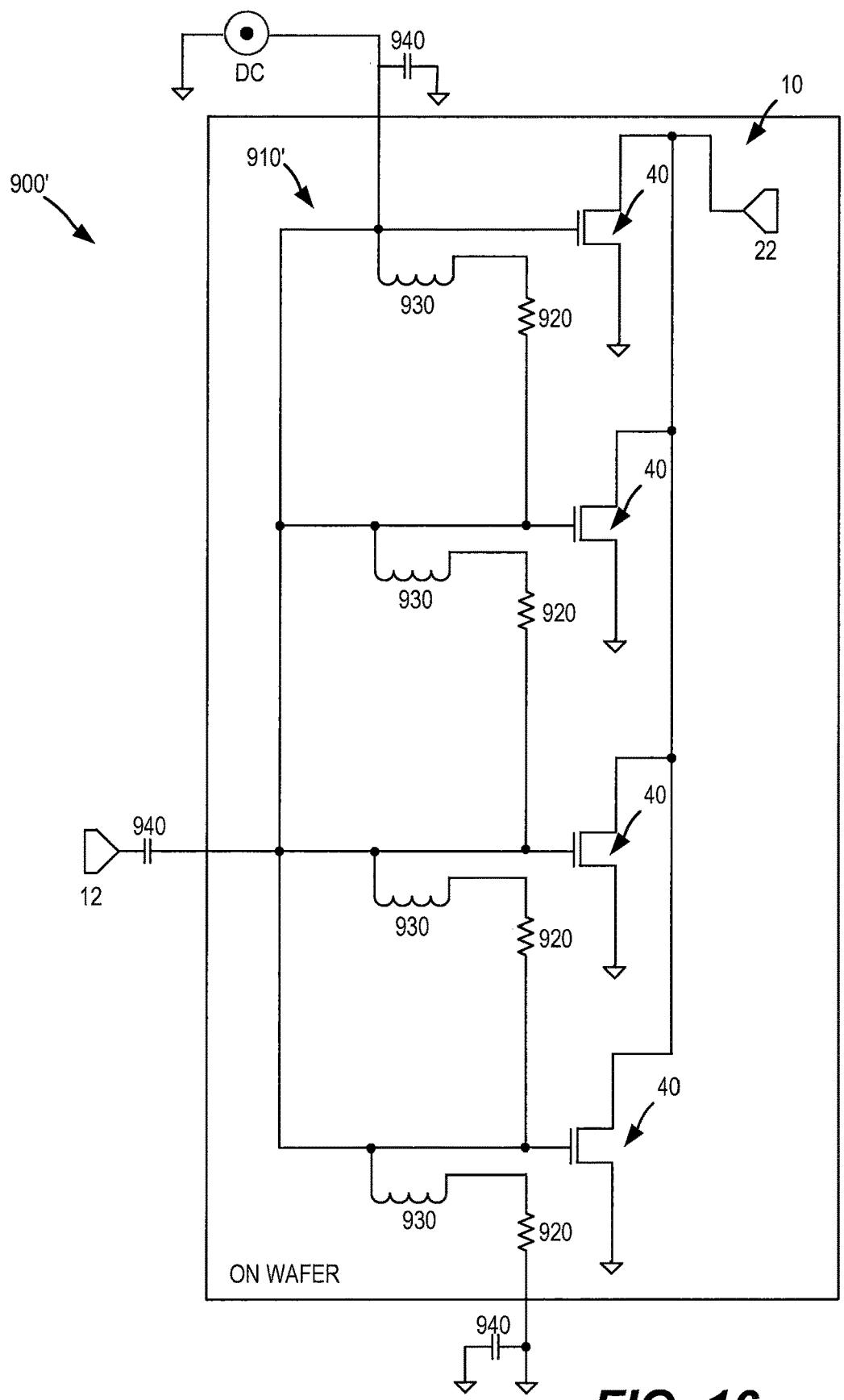
FIG. 16 is a schematic circuit diagram of a semiconductor device according to embodiments of the present invention that includes an on-wafer voltage divider.

FIG. 16 is a circuit diagram that schematically illustrates how a voltage divider may be implemented on the wafer in order to implement a semiconductor device 900' that is similar to the semiconductor device 900 of FIG. 14. As shown in FIG. 16, a voltage divider circuit 910' may be implemented using a series of resistors 920 that are disposed between the gate fingers of the unit cell transistors 40 of the semiconductor device 10 of FIG. 1. The resistors 920 may be sized to create differences in the voltage applied to the gate fingers of adjacent unit cell transistors 40 in response to application of a voltage to the gate. In the embodiment of FIG. 16, a total of four unit cell transistors 40 are shown by way of example, and the voltage divider 910'. As a result, a different voltage will be applied to the gate fingers of the respective unit cell transistors 40 in response to application of a voltage to the gate (i.e., in the embodiment of FIG. 16, every unit cell transistor 40 receives a different gate voltage). It will be appreciated that in other embodiments subsets of the gate fingers may receive the same gate voltages. For example, in another embodiment, each unit cell transistor 40 in FIG. 16 could be replaced with a two, three, four or more unit cell transistors 40 that are disposed in parallel. In such a device, the unit cell transistors 40 would turn-on at four different rates (degrees) in response to application of a gate voltage. four Inductors 930 may be provided for DC coupling and by-pass capacitors 940 may be added for RF decoupling. The resistors 920 may be formed on wafer by, for example, depositing conductive materials that have a different (higher) resistance than the remainder of the conductive lines or by changing the properties of selected portions of the conductive lines (e.g., by oxidization). Such techniques for forming on-wafer resistors are well-known in the art. The inductors 930 may also be implemented on wafer. For example, the inductors 930 may be implemented as meandered conductive lines on the wafer. In the depicted embodiment, the capacitors 940 are formed off of the wafer.

Figure 17:
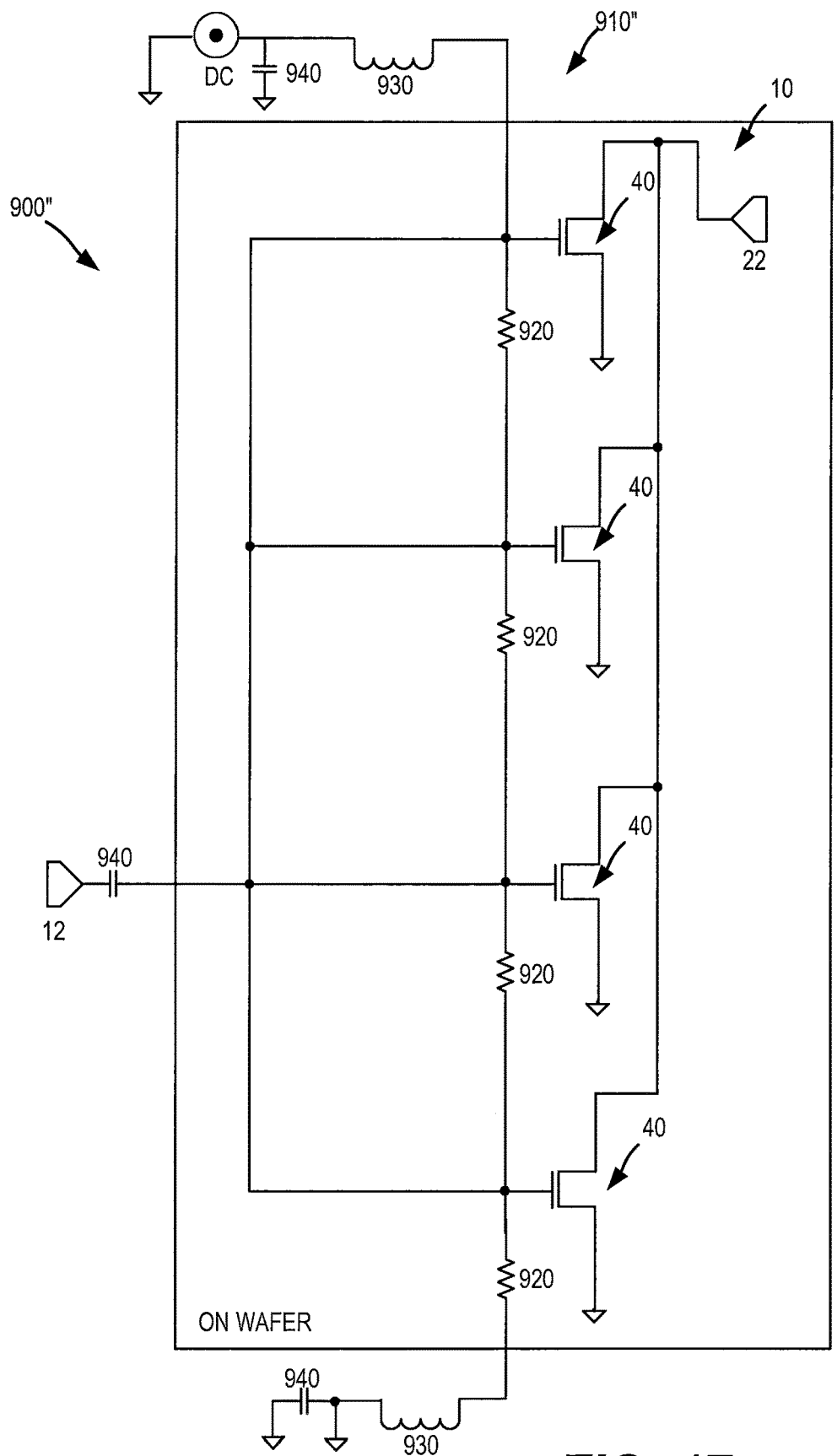
FIG. 17 is a schematic circuit diagram of a semiconductor device according to further embodiments of the present invention that includes a voltage divider that is partially implemented on-wafer.

FIG. 17 is a schematic circuit diagram of a semiconductor device 900" according to further embodiments of the present invention that includes a voltage divider that is partially implemented on-wafer. As shown in FIG. 17, the semiconductor device 900" is very similar to the semiconductor device 900' of FIG. 16, except that the inductors 930 of the voltage divider 910" of semiconductor 900" are implemented off the wafer. Such an implementation may be advantageous in some embodiments because the size of the necessary inductance may be large in some cases, which may make it difficult to implement on the wafer, and/or because the associated loss may be reduced if the inductors 930 are implemented separately off the wafer (as are the capacitors 940). As the semiconductor device 900" otherwise is identical to the semiconductor device 900' of FIG. 16, further description thereof will be omitted.

Embodiments of the present invention may be particularly well suited for use in connection with Group III-nitride based high electron mobility transistor (HEMT) devices. As used herein, the term "Group III nitride" refers to those semiconducting compounds formed between nitrogen and the elements in Group III of the periodic table, usually aluminum (Al), gallium (Ga), and/or indium (In). The term also refers to ternary and quaternary compounds such as AlGaN and AlInGaN. These compounds all have empirical formulas in which one mole of nitrogen is combined with a total of one mole of the Group III elements.

Suitable structures for GaN-based HEMTs that may utilize embodiments of the present invention are described, for example, in commonly assigned U.S. Publication No. 2002/0066908A1 published Jun. 6, 2002, for "Aluminum Gallium Nitride/Gallium Nitride High Electron Mobility Transistors Having A Gate Contact On A Gallium Nitride Based Cap Segment And Methods Of Fabricating Same," U.S. Publication No. 2002/0167023A1 for "Group-III Nitride Based High Electron Mobility Transistor (HEMT) With Barrier/Spacer Layer," published Nov. 14, 2002, U.S. Publication No. 2004/0061129 for "Nitride-Based Transistors And Methods Of Fabrication Thereof Using Non-Etched Contact Recesses," published on Apr. 1, 2004, U.S. Pat. No. 7,906, 799 for "Nitride-Based Transistors With A Protective Layer And A Low-Damage Recess" issued Mar. 15, 2011, and U.S. Pat. No. 6,316,793 entitled "Nitride Based Transistors On Semi-Insulating Silicon Carbide Substrates," issued Nov. 13, 2001, the disclosures of which are hereby incorporated herein by reference in their entirety.

In particular embodiments of the present invention, the substrate 600 may be a semi-insulating silicon carbide (SiC) substrate that may be, for example, 4H polytype of silicon carbide. Other silicon carbide candidate polytypes include the 3C, 6H, and 15R polytypes.

Optional buffer, nucleation and/or transition layers (not shown) may be provided on the substrate 600 beneath the channel layer 610. For example, an AlN buffer layer may be included to provide an appropriate crystal structure transition between the silicon carbide substrate and the remainder of the device. Additionally, strain balancing transition layer(s) may also be provided as described, for example, in commonly assigned U.S. Publication 2003/0102482A1, published Jun. 5, 2003, and entitled "Strain Balanced Nitride Heterojunction Transistors And Methods Of Fabricating Strain Balanced Nitride Heterojunction Transistors," the disclosure of which is incorporated herein by reference as if set forth fully herein. Moreover, one or more capping layers, such as SiN capping layers, may be provided on the barrier layer 620.

Silicon carbide has a much closer crystal lattice match to Group III nitrides than does sapphire ($Al_2O_3$), which is a very common substrate material for Group III nitride devices. The closer lattice match of SiC may result in Group III nitride films of higher quality than those generally available on sapphire. Silicon carbide also has a very high thermal conductivity so that the total output power of Group III nitride devices on silicon carbide is, typically, not as limited by thermal dissipation of the substrate as in the case of the same devices formed on sapphire. Also, the availability of semi-insulating silicon carbide substrates may provide for device isolation and reduced parasitic capacitance. Appropriate SiC substrates are manufactured by, for example, Cree, Inc., of Durham, N.C., the assignee of the present invention.

Although silicon carbide may be used as a substrate material, embodiments of the present invention may utilize any suitable substrate, such as sapphire, aluminum nitride, aluminum gallium nitride, gallium nitride, silicon, GaAs, LGO, ZnO, LAO, InP and the like. In some embodiments, an appropriate buffer layer also may be formed.

In some embodiments of the present invention, the channel layer 610 is a Group III-nitride, such as $Al_xGa_{1-x}N$ where $0 \leq x < 1$, provided that the energy of the conduction band edge of the channel layer 610 is less than the energy of the conduction band edge of the barrier layer 620 at the interface between the channel and barrier layers. In certain embodiments of the present invention, x=0, indicating that the channel layer 610 is GaN. The channel layer 610 may also be other Group III-nitrides such as InGaN, AlInGaN or the like. The channel layer 610 may be undoped or unintentionally doped and may be grown to a thickness of greater than about 20 Å. The channel layer 610 may also be a multi-layer structure, such as a superlattice or combinations of GaN, AlGaN or the like.

The channel layer 610 may have a bandgap that is less than the bandgap of the barrier layer 620, and the channel layer 610 may also have a larger electron affinity than the barrier layer 620. In certain embodiments of the present invention, the barrier layer 620 is AlN, AlInN, AlGaN or AlInGaN. In particular embodiments of the present invention, the barrier layer 620 is thick enough and has a high enough Al composition and doping to induce a significant carrier concentration at the interface between the channel layer 610 and the barrier layer 620.

The barrier layer 620 may be a Group III-nitride and has a bandgap larger than that of the channel layer 610 and a smaller electron affinity than the channel layer 610. Accordingly, in certain embodiments of the present invention, the barrier layer 620 may include AlGaN, AlInGaN and/or AlN or combinations of layers thereof. The barrier layer 620 may, for example, be from about 0.1 nm to about 30 nm thick. In certain embodiments of the present invention, the barrier layer 620 is undoped or doped with an n-type dopant to a concentration less than about $10^{19}$ $cm^{-3}$. In some embodiments of the present invention, the barrier layer 620 is $Al_xGa_{1-x}N$ where $0<x<1$. In particular embodiments, the aluminum concentration is about 25%. However, in other embodiments of the present invention, the barrier layer 620 comprises AlGaN with an aluminum concentration of between about 5% and about 100%. In specific embodiments of the present invention, the aluminum concentration is greater than about 10%.

While embodiments of the present invention are illustrated with reference to a gallium nitride based HEMT structure, the present invention is not limited to such devices. Thus, embodiments of the present invention may be suitable for use in any field effect transistor, and can be used in devices that do or do not have unit cell structures. It will likewise be appreciated that the techniques disclosed herein may also be used in material systems other than gallium nitride based material systems.

It will be appreciated that features of the above-described embodiments may be combined in any way to create a plurality of additional embodiments.

Embodiments of the present invention are described above with reference to the accompanying drawings. The present invention may, however, be embodied in many different forms and should not be construed as limited to the embodiments described herein and/or pictured in the drawings. Rather, these embodiments are provided so that this disclosure will be thorough and complete, and will fully convey the scope of the present invention to those skilled in the art. Like numbers refer to like elements throughout.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" "comprising," "includes" and/or "including" when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms used herein should be interpreted as having a meaning that is consistent with their meaning in the context of this specification and the relevant art and will not be interpreted in an idealized or overly formal sense unless expressly so defined herein.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "lateral" or "vertical" may be used herein to describe a relationship of one element, layer or region to another element, layer or region as illustrated in the figures. It will be understood that these terms are intended to encompass different orientations of the device in addition to the orientation depicted in the figures.

Embodiments of the invention are described herein with reference to cross-section illustrations that are schematic illustrations of idealized embodiments (and intermediate structures) of the invention. The thickness of layers and regions in the drawings may be exaggerated for clarity. Additionally, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing.

In the drawings and specification, there have been disclosed typical embodiments of the invention and, although specific terms are employed, they are used in a generic and descriptive sense only and not for purposes of limitation, the scope of the invention being set forth in the following claims.

What is claimed is:

1. A method comprising:
    providing a gallium nitride based high electron mobility transistor ("HEMT") device that includes a plurality of unit cell transistors on a common semiconductor structure, the unit cell transistors electrically connected in parallel, and each of the unit cell transistors includes a respective gate finger, wherein different portions of the gallium nitride based HEMT device have different respective threshold voltages;
    applying one or more voltage signals to the respective gate fingers of the unit cell transistors in order to turn on different portions of the gallium nitride based HEMT device at respective different levels of current flow,
    wherein a peak third order transconductance of the gallium nitride based HEMT device is at least 30% less than a peak third order transconductance of an equivalent device having a uniform threshold voltage.

2. The method of claim 1, wherein first and second segments of at least some of the gate fingers have threshold voltages that differ by at least 0.1 volts.

3. The method of claim 1, wherein different ones of the unit cell transistors have threshold voltages that differ by at least 0.1 volts.

4. The method of claim 3, wherein the unit cell transistors are divided into a plurality of groups, each of the groups includes at least five unit cell transistors, and wherein the unit cell transistors within each of the groups have substantially constant threshold voltages that are within 0.01 volts of each other.

5. The method of claim 4, wherein each of the groups includes approximately the same number of unit cell transistors.

6. The method of claim 4, wherein the plurality of groups is at least three groups.

7. The method of claim 4, wherein the threshold voltages of the unit cell transistors in different ones of the groups differ by at least 0.1 volts and by no more than 0.8 volts.

8. The method of claim 1, wherein two of the different portions of the gallium nitride based HEMT device have levels of current flow in respective two dimensional electron gas channels that differ by at least 10%.

9. The method of claim 1, wherein two of the different portions of the gallium nitride based HEMT device have levels of current flow that differ by between 10-30%.

10. A method comprising:
    providing a semiconductor device that includes a plurality of unit cell transistors on a common semiconductor structure, the unit cell transistors electrically connected in parallel, and each of the unit cell transistors includes a respective gate finger, wherein a first portion of the semiconductor device has a first threshold voltage and a second portion of the semiconductor device has a second threshold voltage that differs from the first threshold voltage by 0.1 to 0.8 volts; and
    applying one or more voltage signals to the respective gate fingers of the unit cell transistors in order to turn on different portions of the semiconductor device at respective different levels of current flow,
    wherein the semiconductor structure includes a gallium nitride based channel layer and a gallium nitride based barrier layer on the gallium nitride based channel layer, and
    wherein the gate fingers extend in parallel to one another.

11. The method of claim 1, wherein first and second segments of at least some of the gate fingers have threshold voltages that differ by at least 0.25 volts.

12. The method of claim 1, wherein a first of the unit cell transistors has a threshold voltage that differs by at least 0.25 volts from a threshold voltage of a second of the unit cell transistors.

13. The method of claim 10, wherein percentages of the device that have the respective first and second threshold voltages are selected to reduce a peak third order transconductance of the semiconductor device by at least 30%.

14. The method of claim 10, wherein first and second segments of at least some of the gate fingers have threshold voltages that differ by at least 0.25 volts, and
    wherein portions of at least one of the gallium nitride based channel layer and the gallium nitride based barrier layer are doped differently to vary the threshold voltages of the first and second segments of the at least some of the gate fingers.

15. The method of claim 10, wherein different portions of the gallium nitride based barrier layer have different material compositions.

16. A method of operating a gallium nitride based high electron mobility transistor ("HEMT") having a channel layer and a barrier layer on the channel layer, the method comprising:
    providing a plurality of unit cell transistors that are electrically connected in parallel on a semiconductor structure to provide the gallium nitride based HEMT,
    wherein the gallium nitride based HEMT is configured so that different unit cell transistors or different portions of the same unit cell transistor will exhibit different levels of current flow during turn-on in response to a simultaneous application of one or more voltage signals to the unit cell transistors and so that a third order transconductance of the gallium nitride based HEMT will exhibit multiple positive peaks, wherein a first portion of the gallium nitride based HEMT has a first threshold voltage and a second portion of the gallium nitride based HEMT has a second threshold voltage that differs from the first threshold voltage by 0.1 to 0.8 volts.

17. The method of claim 16, wherein the barrier layer comprises an $Al_xGa_{1-x}N$ barrier layer, and wherein the value of x differs under different portions of the gallium nitride based HEMT.

18. A method, comprising:

providing a gallium nitride based high electron mobility transistor ("HEMT") device that includes a plurality of unit cell transistors on a common semiconductor structure, the unit cell transistors electrically connected in parallel, and each of the unit cell transistors includes a respective gate finger;

applying one or more voltage signals to the respective gate fingers of the unit cell transistors in order to turn on different portions of the gallium nitride based HEMT device at respective different levels of current flow, wherein each of the unit cell transistors has a respective threshold voltage along the width of its respective gate finger, wherein the gate fingers of the unit cell transistors are divided into a plurality of groups, wherein the threshold voltages of unit cell transistors corresponding to gate fingers in different ones of the groups vary by at least 0.1 volts and by no more than 0.8 volts.

19. The method of claim 18, wherein the threshold voltages of the unit cell transistors corresponding to the gate fingers within each of the respective groups are within 0.025 volts of each other.

* * * * *